(12) United States Patent
Bushnaq

(10) Patent No.: US 11,145,371 B2
(45) Date of Patent: Oct. 12, 2021

(54) SEMICONDUCTOR MEMORY DEVICE

(71) Applicant: KIOXIA CORPORATION, Tokyo (JP)

(72) Inventor: Sanad Bushnaq, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/158,321

(22) Filed: Jan. 26, 2021

(65) Prior Publication Data

US 2021/0151110 A1    May 20, 2021

Related U.S. Application Data

(60) Continuation of application No. 16/901,632, filed on Jun. 15, 2020, now Pat. No. 10,937,500, which is a continuation of application No. 16/749,710, filed on Jan. 22, 2020, now Pat. No. 10,714,182, which is a continuation of application No. 16/397,009, filed on Apr. 29, 2019, now Pat. No. 10,580,494, which is a division of application No. 15/447,116, filed on Mar. 2, 2017, now Pat. No. 10,325,656.

(30) Foreign Application Priority Data

Sep. 16, 2016 (JP) .................. 2016-181994

(51) Int. Cl.
| | |
|---|---|
| *G11C 11/34* | (2006.01) |
| *G11C 16/04* | (2006.01) |
| *H01L 27/11582* | (2017.01) |
| *G11C 16/08* | (2006.01) |
| *G11C 16/30* | (2006.01) |
| *H01L 23/528* | (2006.01) |
| *H01L 27/11556* | (2017.01) |
| *H01L 27/1157* | (2017.01) |

(52) U.S. Cl.
CPC .......... *G11C 16/0483* (2013.01); *G11C 16/08* (2013.01); *G11C 16/30* (2013.01); *H01L 23/528* (2013.01); *H01L 27/1157* (2013.01); *H01L 27/11556* (2013.01); *H01L 27/11582* (2013.01)

(58) Field of Classification Search
CPC ..... G11C 16/0483; G11C 16/08; G11C 16/30; H01L 23/528; H01L 27/11556; H01L 27/1157; H01L 27/11582
USPC .................................................. 365/185.13
See application file for complete search history.

(56) References Cited

U.S. PATENT DOCUMENTS

| | | |
|---|---|---|
| 5,886,923 A | 3/1999 | Hung |
| 5,999,479 A | 12/1999 | Park et al. |

(Continued)

*Primary Examiner* — Viet Q Nguyen
(74) *Attorney, Agent, or Firm* — Kim & Stewart LLP

(57) ABSTRACT

A semiconductor memory device comprises a memory string that includes a plurality of memory cells electrically connected in series, the memory cells including first to fourth memory cells, first to fourth word lines that are electrically connected to gates of the first to fourth memory cells, respectively, a voltage generation circuit configured to generate a first voltage, a first circuit configured to output the first voltage to one of first and second wires, a second circuit configured to connect the first and second wires to the first and second word lines, respectively, and a third circuit configured to connect the first and second wires to the third and fourth word lines, respectively.

16 Claims, 22 Drawing Sheets

(56) References Cited

U.S. PATENT DOCUMENTS

| | | |
|---|---|---|
| 6,252,798 B1 | 6/2001 | Satoh et al. |
| 6,373,780 B1 | 4/2002 | Micheloni et al. |
| 6,504,758 B2 | 1/2003 | Sacco et al. |
| 9,773,555 B2 | 9/2017 | Bushnaq et al. |
| 9,786,377 B2 * | 10/2017 | Bushnaq ................ G11C 5/025 |
| 9,799,406 B2 * | 10/2017 | Sato ....................... G11C 16/08 |
| 9,811,270 B2 * | 11/2017 | Maejima ............... G06F 3/0665 |
| 9,824,758 B2 | 11/2017 | Lee |
| 9,922,717 B1 * | 3/2018 | Maejima ................ G11C 16/26 |
| 9,940,031 B2 | 4/2018 | Futatsuyama |
| 9,953,715 B2 | 4/2018 | Bushnaq et al. |
| 10,062,438 B2 | 8/2018 | Sukegawa et al. |
| 10,325,656 B2 * | 6/2019 | Bushnaq ................ G11C 16/30 |
| 10,325,667 B2 | 6/2019 | Bushnaq et al. |
| 10,522,227 B2 * | 12/2019 | Kobayashi ............. G11C 16/32 |
| 10,580,494 B2 | 3/2020 | Bushnaq |
| 10,658,057 B2 | 5/2020 | Maeda |
| 10,748,620 B2 * | 8/2020 | Yip ................... H01L 27/11573 |
| 10,896,736 B2 * | 1/2021 | Sudo ..................... G11C 16/14 |
| 10,902,920 B2 * | 1/2021 | Piccardi .................. G11C 8/08 |
| 2001/0005330 A1 | 6/2001 | Choi |
| 2006/0146639 A1 | 7/2006 | Fasoli et al. |
| 2006/0291292 A1 | 12/2006 | Kwon et al. |
| 2008/0159005 A1 | 7/2008 | Lee et al. |
| 2009/0003067 A1 | 1/2009 | Kang et al. |
| 2009/0040828 A1 | 2/2009 | Ryu et al. |
| 2009/0097325 A1 | 4/2009 | Won et al. |
| 2009/0231919 A1 | 9/2009 | Won et al. |
| 2010/0008165 A1 | 1/2010 | Macerola et al. |
| 2010/0302865 A1 | 12/2010 | Wang |
| 2010/0329047 A1 | 12/2010 | Kim |
| 2011/0273219 A1 | 11/2011 | Marotta et al. |
| 2011/0310666 A1 | 12/2011 | Miida et al. |
| 2012/0120725 A1 | 5/2012 | Ahn et al. |
| 2012/0268997 A1 | 10/2012 | Choi et al. |
| 2013/0070541 A1 | 3/2013 | Chung |
| 2013/0107654 A1 | 5/2013 | Kang |
| 2014/0064001 A1 | 3/2014 | Heo |
| 2014/0104948 A1 | 4/2014 | Rhie |
| 2015/0279471 A1 | 10/2015 | Lee et al. |
| 2015/0380097 A1 | 12/2015 | Sato et al. |
| 2016/0078942 A1 | 3/2016 | Lee et al. |
| 2016/0141038 A1 | 5/2016 | An |
| 2016/0372204 A1 | 12/2016 | Lee |
| 2017/0103811 A1 | 4/2017 | Lee |
| 2018/0025781 A1 | 1/2018 | Rhie |

* cited by examiner

FIG. 22

|  | BLSTP0 | BLSTP1 | BLSTP2 | BLSTP3 | BLSTP4 | BLSTP5 | BLSTP6 | BLSTP7 | BLSTP8 | BLSTP9 | BLSTP10 | BLSTP11 |
|---|---|---|---|---|---|---|---|---|---|---|---|---|
| N−3_D | CG⟨11⟩ | CG⟨0⟩ | CG⟨1⟩ | CG⟨2⟩ | CG⟨3⟩ | CG⟨4⟩ | CG⟨5⟩ | CG⟨6⟩ | CG⟨7⟩ | CG⟨8⟩ | CG⟨9⟩ | CG⟨10⟩ |
| N−4_D | CG⟨10⟩ | CG⟨11⟩ | CG⟨0⟩ | CG⟨1⟩ | CG⟨2⟩ | CG⟨3⟩ | CG⟨4⟩ | CG⟨5⟩ | CG⟨6⟩ | CG⟨7⟩ | CG⟨8⟩ | CG⟨9⟩ |
| N−5_D | CG⟨9⟩ | CG⟨10⟩ | CG⟨11⟩ | CG⟨0⟩ | CG⟨1⟩ | CG⟨2⟩ | CG⟨3⟩ | CG⟨4⟩ | CG⟨5⟩ | CG⟨6⟩ | CG⟨7⟩ | CG⟨8⟩ |
| N±6_D | CG⟨8⟩ | CG⟨9⟩ | CG⟨10⟩ | CG⟨11⟩ | CG⟨0⟩ | CG⟨1⟩ | CG⟨2⟩ | CG⟨3⟩ | CG⟨4⟩ | CG⟨5⟩ | CG⟨6⟩ | CG⟨7⟩ |
| N+5_D | CG⟨7⟩ | CG⟨8⟩ | CG⟨9⟩ | CG⟨10⟩ | CG⟨11⟩ | CG⟨0⟩ | CG⟨1⟩ | CG⟨2⟩ | CG⟨3⟩ | CG⟨4⟩ | CG⟨5⟩ | CG⟨6⟩ |
| N+4_D | CG⟨6⟩ | CG⟨7⟩ | CG⟨8⟩ | CG⟨9⟩ | CG⟨10⟩ | CG⟨11⟩ | CG⟨0⟩ | CG⟨1⟩ | CG⟨2⟩ | CG⟨3⟩ | CG⟨4⟩ | CG⟨5⟩ |
| N+3_D | CG⟨5⟩ | CG⟨6⟩ | CG⟨7⟩ | CG⟨8⟩ | CG⟨9⟩ | CG⟨10⟩ | CG⟨11⟩ | CG⟨0⟩ | CG⟨1⟩ | CG⟨2⟩ | CG⟨3⟩ | CG⟨4⟩ |
| N+2_D | CG⟨4⟩ | CG⟨5⟩ | CG⟨6⟩ | CG⟨7⟩ | CG⟨8⟩ | CG⟨9⟩ | CG⟨10⟩ | CG⟨11⟩ | CG⟨0⟩ | CG⟨1⟩ | CG⟨2⟩ | CG⟨3⟩ |
| N+1_D | CG⟨3⟩ | CG⟨4⟩ | CG⟨5⟩ | CG⟨6⟩ | CG⟨7⟩ | CG⟨8⟩ | CG⟨9⟩ | CG⟨10⟩ | CG⟨11⟩ | CG⟨0⟩ | CG⟨1⟩ | CG⟨2⟩ |
| N_D | CG⟨2⟩ | CG⟨3⟩ | CG⟨4⟩ | CG⟨5⟩ | CG⟨6⟩ | CG⟨7⟩ | CG⟨8⟩ | CG⟨9⟩ | CG⟨10⟩ | CG⟨11⟩ | CG⟨0⟩ | CG⟨1⟩ |
| N−1_D | CG⟨1⟩ | CG⟨2⟩ | CG⟨3⟩ | CG⟨4⟩ | CG⟨5⟩ | CG⟨6⟩ | CG⟨7⟩ | CG⟨8⟩ | CG⟨9⟩ | CG⟨10⟩ | CG⟨11⟩ | CG⟨0⟩ |
| N−2_D | CG⟨0⟩ | CG⟨1⟩ | CG⟨2⟩ | CG⟨3⟩ | CG⟨4⟩ | CG⟨5⟩ | CG⟨6⟩ | CG⟨7⟩ | CG⟨8⟩ | CG⟨9⟩ | CG⟨10⟩ | CG⟨11⟩ |

SEMICONDUCTOR MEMORY DEVICE

CROSS-REFERENCE TO RELATED APPLICATIONS

This application is a continuation of U.S. patent application Ser. No. 16/901,632, filed on Jun. 15, 2020, which is a continuation of U.S. patent application Ser. No. 16/749,710, filed on Jan. 22, 2020, now U.S. Pat. No. 10,714,182, issued on Jul. 14, 2020, which is a continuation of U.S. patent application Ser. No. 16/397,009, filed on Apr. 29, 2019, now U.S. Pat. No. 10,580,494, issued on Mar. 3, 2020, which is a division of U.S. patent application Ser. No. 15/447,116, filed on Mar. 2, 2017, now U.S. Pat. No. 10,325,656, issued on Jun. 18, 2019, which is based upon and claims the benefit of priority from Japanese Patent Application No. 2016-181994, filed on Sep. 16, 2016, the entire contents of each of which are incorporated herein by reference.

FIELD

Embodiments described herein relate generally to a semiconductor memory device.

BACKGROUND

NAND flash memory is known as a semiconductor memory device.

BRIEF DESCRIPTION OF THE DRAWINGS

FIG. 22 is a table illustrating a relationship between a dedicated driver, a level shifter, and a wire CG in the semiconductor memory device according to the second embodiment.

DETAILED DESCRIPTION

Figure 1:
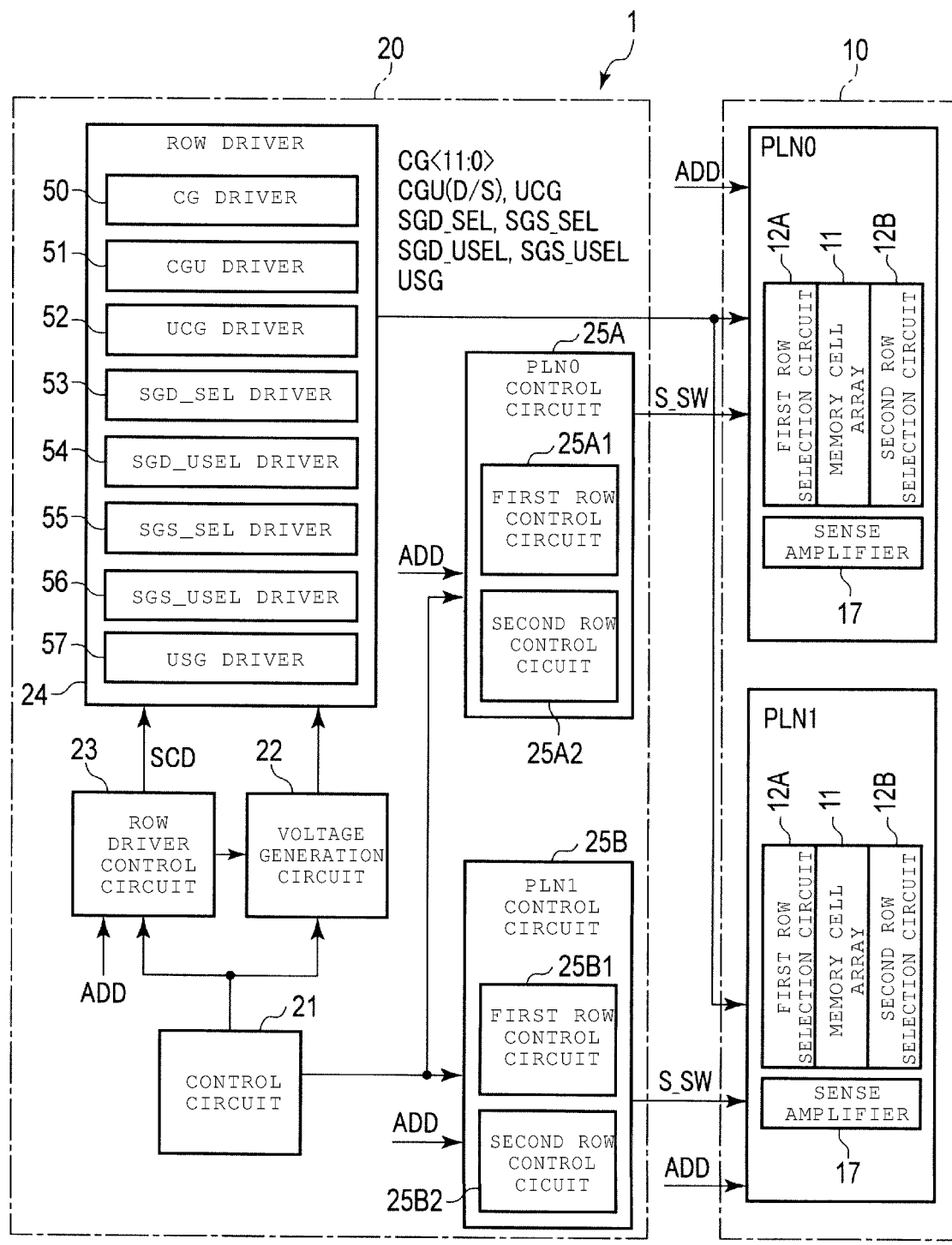
FIG. 1 is a block diagram illustrating a semiconductor memory device according to a first embodiment.

Embodiments provide a semiconductor memory device that is capable of suppressing an increase in a chip area.

According to an embodiment, there is provided a semiconductor memory device including a memory string that includes a plurality of memory cells electrically connected in series, the memory cells including first to fourth memory cells, first to fourth word lines that are electrically connected to gates of the first to fourth memory cells, respectively, a voltage generation circuit configured to generate a first voltage, a first circuit configured to output the first voltage to one of first and second wires, a second circuit configured to connect the first and second wires to the first and second word lines, respectively, and a third circuit configured to connect the first and second wires to the third and fourth word lines, respectively.

Embodiments will be described below with reference to the drawings. Descriptions are provided with like elements being given like reference numerals throughout the drawings.

1. First Embodiment

A semiconductor memory device according to a first embodiment is described. A three-dimensional stacked NAND flash memory in which memory cell transistors are stacked up on a semiconductor substrate will be described below as an example of a semiconductor memory device.

1.1 Configuration of the Entire Semiconductor Memory Device

First, a configuration of an entire semiconductor memory device is described with reference to FIG. 1. Moreover, in the example in FIG. 1, for brevity, one portion of a wire (or a bus) that connects the blocks is shown.

FIG. 1 is a block diagram of the semiconductor memory device. A NAND flash memory 1, as illustrated, generally includes a core unit 10 and a peripheral circuit 20.

The core unit 10, for example, includes two planes PLN0 and PLN1. The planes PLNs (PLN0 and PLN1) each contain a memory cell array, row selection circuits, and a sense amplifier. The planes PLN0 and PLN1 are able to operate independently of each other, and are also able to operate at the same time. Moreover, the number of planes PLNs is not limited to 2. The number of planes PLNs may be 1 and may be 3 or greater. According to the present embodiment, the core unit 10 includes two planes PLN and where the two planes PLN have the same configuration. The plane PLN0 and plane PLN1 are referred to as the "plane PLN" when they do not need to be distinguished from one another.

Each plane PLN includes a memory cell array 11, a first row selection circuit 12A, a second row selection circuit 12B, and a sense amplifier 17. Alternatively, one sense amplifier 17 that is common to the planes PLN0 and PLN1 may be provided.

The memory cell array 11 includes a plurality of blocks each of which is a set of a plurality of nonvolatile memory cell transistors. The memory cell array 11 will be described in detail below.

The first row selection circuit 12A decodes address information ADD (for example, a plane address, a chunk address, a block address, a page address, or the like) for example, when performing writing, reading, and erasing operations, and selects a target wire (e.g., a word line and a selection gate line that will be described below) in the row direction. The second row selection circuit 12B also has the same configuration. The first row selection circuit 12A and the second row selection circuit 12B are assigned to different blocks within a target memory cell array.

An example configuration of the page address is disclosed in U.S. patent application Ser. No. 13/784,753 filed on Mar. 4, 2013, which is entitled "NONVOLATILE SEMICONDUCTOR MEMORY DEVICE AND CONTROL METHOD THEREOF." This patent application is incorporated by reference herein in its entirety.

Based on the address information ADD (for example, column address information), during the reading, the sense amplifier 17 senses data that is read from the memory cell transistor to a bit line. During the writing, the sense amplifier 17 transfers the data that is to be written to the memory cell transistor.

The peripheral circuit 20 includes a control circuit 21, a voltage generation circuit 22, a row driver control circuit 23, a row driver 24, a PLN0 control circuit 25A, and a PLN1 control circuit 25B.

Based on a control signal SCD that is transmitted from the row driver control circuit 23, the row driver 24 supplies a voltage from the voltage generation circuit 22 to each of the first row selection circuit 12A and the second row selection circuit 12B of each plane PLN. The first row selection circuit 12A and the second row selection circuit 12B are referred to as the "row selection circuit 12" when they do not need to be distinguished from one another.

The row driver 24 includes a CG driver 50, a CGU driver 51, a UCG driver 52, an SGD_SEL driver 53, an SGD_USEL driver 54, an SGS_SEL driver 55, an SGS_USEL driver 56, and a USG driver 57.

The CG driver 50 is connected to each row selection circuit 12 through twelve wires CG (CG<11:0>). The CG driver 50 supplies a voltage applied to a plurality of word lines (12 word lines according to the present embodiment) that include a selected word line in a selected group, for example, in writing and reading operations. Moreover, the number of wires CG that connect between the CG driver 50 and each row selection circuit 12 is not limited to twelve and may be smaller or greater in other embodiments.

The plurality of word lines to which the CG driver 50 supplies a voltage is described. For example, during the writing, if a word line WLi (i is an integer that is equal to or greater than 0) is selected, due to interference with a selected word line WLi to which a high-voltage program voltage VPGM is applied, a likelihood that erroneous writing will occur is higher in the memory cell transistor that corresponds to certain non-selected word lines, e.g., WL (i−4) to WL (i+4) than in the memory cell transistor that is connected to different non-selected word lines WL. For this reason, the CG driver 50 applies a suitable voltage to the plurality of (for example, 12) word lines WL that include word lines, WL (i−4) to WL (i+4). Furthermore, during the reading, in the same manner, the CG driver 50 applies a suitable voltage to the plurality of (for example, 12) word lines WL that include the word lines, WL (i−4) to WL (i+4). The selected word line WLi, hereinafter, is expressed simply as the "selected word line WL".

More specifically, for example, during the writing, the CG driver 50 may apply a voltage VPGM to the selected word line WLi, apply a voltage VPASS1 to a non-selected word line WL (i+1), apply a voltage VPASS2 to a non-selected word line WL (i−1), apply a voltage VPASS3 to non-selected word lines WL (i+2), WL (i+3), WL (i−2), and WL (i−3), and apply a voltage VPASS to non-selected word lines WL (i+4), WL (i+5), and WL (i−4) to WL (i−6).

The voltage VPGM is a high voltage that is applied to a selected word line WL when performing the writing to a selected page. The voltages VPASS, and VPASS1 to VPASS3 are voltages that causes the memory cell transistor to be in an ON state without regard to a threshold voltage of the memory cell transistor. The voltages VPGM and the voltages VPASS and VPASS1 to VPASS3 have the relationship of VPGM>(VPASS, or VPASS1 to VPASS3). Moreover, the voltages VPASS and VPASS1 to VPASS3 may be the same voltage or be different from one another. Additionally, any combination of voltages may be applied to non-selected word lines WL.

The CGU driver 51 is connected to each row selection circuit 12 through wires CGU(D) and CGU(S). For example, in writing and reading operations, the CGU driver 51 provides a voltage that is applied to the non-selected word line WL within the selected block to which a voltage is not supplied from the CG driver 50. According to the present embodiment, the wire CGU(D) corresponds to the non-selected word line WL that is positioned on a layer above the selected word line WL, and the wire CGU(S) corresponds to the non-selected word line WL that is positioned on a layer below the selected word line WL. Moreover, voltages of the wire CGU(D) and the wire CGU(D) may be the same. The wires CGU(D) and CGU(S) are referred to as the "wire CGU(D/S)" when they do not need to be distinguished from one another. In alternative embodiments, the number of wires CGUs may be 1 or be 3 or greater.

The UCG driver 52 is connected to each row selection circuit 12 through a wire UCG. The UCG driver 52 supplies a voltage that is to be applied to a word line WL within a non-selected block, for example, in the writing and reading operations. In alternative embodiments, the number of wires UCG may be different, and different voltages may be applied to a plurality of wires UCG.

The SGD_SEL driver 53 is connected to each row selection circuit 12 through a wire SGD_SEL. The SGD_SEL driver 53 supplies a voltage that is to be applied to a selection gate line SGD within the selected block that will be described below, for example, in the writing and reading operations.

The SGD_USEL driver 54 is connected to each row selection circuit 12 through a wire SGD_USEL. The SGD_USEL driver 54 supplies a voltage that is to be applied to a non-selected gate line SGD within the selected block that will be described below, for example, in the writing and reading operations.

The SGS_SEL driver 55 is connected to each row selection circuit 12 through a wire SGS_SEL. The SGS_SEL driver 55 supplies a voltage that is to be applied to a selection gate line SGS within the selected block that will be described below, for example, in the writing and reading operations.

The SGS_USEL driver 56 is connected to row selection circuit 12 through a wire SGS_USEL. The SGS_USEL driver 56 supplies a voltage that is to be applied to a non-selected gate line SGS within the selected block that will be described below, for example, in the writing and reading operations.

The USG driver 57 is connected to each row selection circuit 12 through a wire USG. The USG driver 57 supplies a voltage that is to be applied to the selection gate lined SGD and SGS within the non-selected block that will be described below, for example, in the writing and reading operations.

Based on control by the control circuit 21 and the address information ADD (for example, the page address), the row driver control circuit 23 controls the row driver 24 and the voltage generation circuit 22. The row driver control circuit 23 transmits the control signal SCD to each of the drivers 50 to 57 within the row driver 24, and controls the drivers 50 to 57. More specifically, the row driver control circuit 23 controls a voltage that is applied to the word lines WL and the selection gate lines SGD and SGS, and a timing at which the voltage is applied. Additionally, based on the address information ADD, the row driver control circuit 23, for example, determines which voltage is supplied to which a wire CG. That is, the row driver control circuit 23 determines the wire CG that corresponds to the selected word line WL.

Under the control of the control circuit 21 or the row driver control circuit 23, the voltage generation circuit 22 generates voltages necessary for writing, reading, and erasing data. For example, the voltage generation circuit 22 supplies a voltage necessary for a wire (e.g., the word line WL and the selection gate lines SGD and SGS) in the row direction to each of the drivers 50 to 57 within the row driver 24.

Based on the control by the control circuit 21 and the address information ADD (for example, the plane address, the chunk address, the block address, the page address, or the like), the PLN0 control circuit 25A controls each row selection circuit 12 within the plane PLN0. The PLN0 control circuit 25A includes a first row control circuit 25A1 and a second row control circuit 25A2.

The first row control circuit 25A1 transmits a control signal S_SW to the first row selection circuit 12A in the plane PLN0, and controls the first row selection circuit 12A.

The second row control circuit 25A2 transmits the control signal S_SW to the second row selection circuit 12B in the plane PLN0, and controls the second row selection circuit 12B.

The PLN1 control circuit 25B has the same configuration as the PLN0 control circuit 25A, and controls each row selection circuit 12 within the plane PLN1. The PLN1 control circuit 25B includes a first row control circuit 25B1 and a second row control circuit 25B2.

The first row control circuit 25B1 transmits the control signal S_SW to the first row selection circuit 12A in the plane PLN1 and controls the first row selection circuit 12A.

The second row control circuit 25B2 transmits the control signal S_SW to the second row selection circuit 12B in the plane PLN1, and controls the second row selection circuit 12B.

In the manner described above, the control circuit 21 controls operation of the NAND flash memory 1.

1.2 Configuration of the Plane

Figure 2:
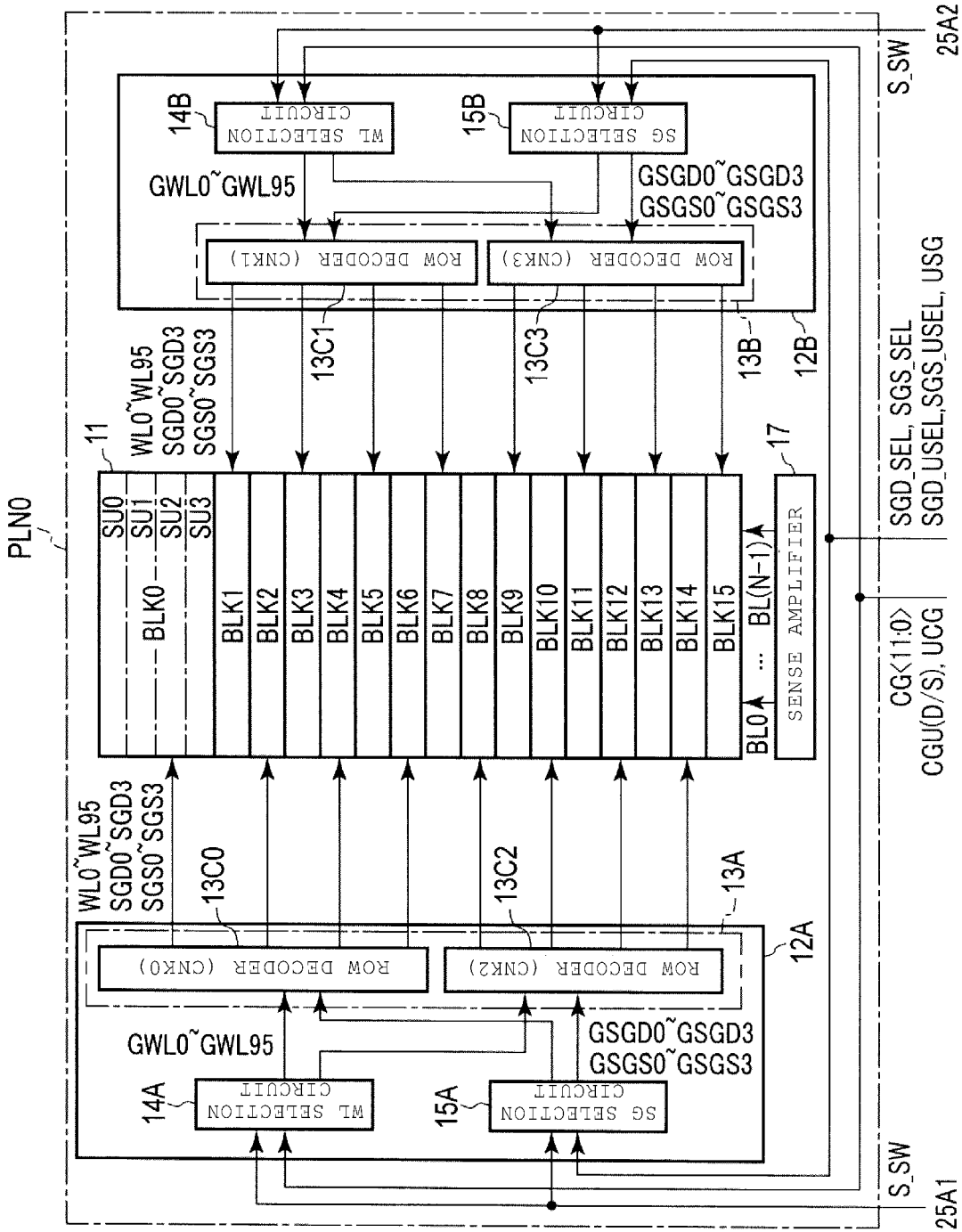
FIG. 2 is a block diagram illustrating a plane that is included in the semiconductor memory device according to the first embodiment.

Next, a configuration of the plane PLN is described with reference to FIG. 2. Although FIG. 2 illustrates the plane PLN0, the plane PLN1 also has the same configuration as well. Moreover, in the example of FIG. 2, a case is illustrated where 96 word lines WL0 to WL95 are connected to one block BLK and selection gate lines SGD0 to SGD3 and selection gate lines SGS0 to SGS3 are connected to string units SU0 to SU3, respectively.

The memory cell array 11, for example, includes 16 blocks BLKs (BLK0 to BLK15) each of which includes nonvolatile memory cell transistors that are associated with a row and a column. Each block BLK, for example, includes four string units SU (SU0 to SU3). The number of blocks BLK within the memory cell array 11 and the number of string units SU within a block are not limited to 16 and 4, respectively. The block BLK will be described in detail below.

The memory cell array 11 includes four chunks CNK (CNK0 to CNK4). Each chunk CNK is a set of blocks BLK. In an example in FIG. 2, one chunk CNK includes four blocks BLK. More specifically, the chunk CNK0 includes blocks BLK0, BLK2, BLK4, and BLK6. The chunk CNK1 includes blocks BLK1, BLK3, BLK5, and BLK7. The chunk CNK2 includes blocks BLK8, BLK10, BLK12, and BLK14. The chunk CNK3 includes blocks BLK9, BLK11, BLK13, and BLK15. The number of chunks CNK within the memory cell array 11 and the number of and combinations of blocks BLK within one chunk CNK may be different in other embodiments.

The first row selection circuit 12A supplies a voltage to the wire in the row direction of the chunks CNK0 and CNK2. The first row selection circuit 12A includes a row decoder group 13A, a WL selection circuit 14A, and an SG selection circuit 15A.

The row decoder group 13A includes a row decoder 13C0 that corresponds to the chunk CNK0, and a row decoder 13C2 that corresponds to the chunk CNK2.

The row decoder 13C0 decodes the address information ADD and selects any one of the blocks BLK within the chunk CNK0. More specifically, if the chunk CNK0 is selected, the row decoder 13C0 electrically connects to wires GWL0 to GWL95, GSGD0 to GSGD3, and GSGS0 to GSGS3, and word lines WL0 to WL95, selection gate lines SGD0 to SGD3, and selection gate lines SGS0 to SGS3, which correspond to a selected block BLK.

The row decoder 13C2 has the same configuration as the row decoder 13C0, and corresponds to the chunk CNK2.

The WL selection circuit 14A supplies a voltage that is to be applied to the word line WL in the selected block BLK, to the row decoder 13C0 or 13C2, according to the control signal S_SW that is transmitted from the first row control circuit 25A1. More specifically, an input terminal of the WL selection circuit 14A is connected to the wires CG<11:0>, CGU (D/S), and UCG. An output terminal of the WL selection circuit 14A is connected to the row decoder 13C0 through the wires GWL0 to GWL95 that correspond to the chunk CNK0, and is connected to the row decoder 13C2 through other wires GWL0 to GWL95 that correspond to the chunk CNK2. Then, if any one of the blocks BLK within the chunk CNK0 is selected, the WL selection circuit 14A outputs voltages of the wires CG<11:0> and CGU (D/S) to the row decoder 13C0 through the wires GWL0 to GWL95 that correspond to the chunk CNK0. On the other hand, if any one of the blocks BLK within the chunk CNK2 is selected, the WL selection circuit 14A outputs the voltages of the wires CG<11:0> and CGU (D/S) to the row decoder 13C2 through the wires GWL0 to GWL95 that correspond to the chunk CNK2.

The SG selection circuit 15A supplies a voltage that is applied to the selection gate lines SGD and SGS in the selected block BLK, to the row decoder 13C0 or 13C2 according to the control signal S_SW that is transmitted from the first row control circuit 25A1. More specifically, an input terminal of the SG selection circuit 15A is connected to the wires SGD_SEL, SGD_USEL, SGS_SEL, SGS_USEL, and USG. An output terminal of the SG selection circuit 15A is connected to the row decoder 13C0 through the wires GSGD0 to GSGD3, and GSGS0 to GSGS3 that correspond to the chunk CNK0, and is connected to the row decoder 13C2 through other wires GSGD0 to GSGD3, and GSGS0 to GSGS3 that correspond to the chunk CNK2. Then, if any one of the blocks BLK within the chunk CNK0 is selected, the SG selection circuit 15A outputs voltages of the wires SGD_SEL, SGD_USEL, SGS_SEL, and SGS_USEL to the row decoder 13C0 through the wires GSGD0 to GSGD3 and GSGS0 to GSGS3 that correspond to the chunk CNK0. On the other hand, if any one of the blocks BLK within the chunk CNK2 is selected, the SG selection circuit 15A outputs voltages of the wires SGD_SEL, SGD_USEL, SGS_SEL, and SGS_USEL to the row decoder 13C2 through the wires GSGD0 to GSGD3 and GSGS0 to GSGS3 that correspond to the chunk CNK2.

More specifically, for example, if the string unit SU0 in the block BLK0 (the chunk CNK0) is selected, the SG selection circuit 15A outputs a voltage of the wire SGD_SEL to the row decoder 13C0 through the wire GSGD0, and outputs a voltage of the wire SGD_USEL to the row decoder 13C0 through the wires GSGD1 to GSGD3. Furthermore, the SG selection circuit 15A outputs a voltage of the wire SGS_SEL to the row decoder 13C0 through the wire GSGS0, and outputs a voltage of the wire SGS_USEL to the row decoder 13C0 through the wires GSGS1 to GSGS3.

The second row selection circuit 12B has the same configuration as the first row selection circuit 12A, and supplies a voltage to the wire in the row direction of the chunks CNK1 and CNK3. The second row selection circuit 12B includes a row decoder group 13B, a WL selection circuit 14B, and an SG selection circuit 15B.

The row decoder group 13B has the same configuration as the row decoder group 13A, and includes a row decoder 13C1 that corresponds to the chunk CNK1 and a row decoder 13C3 that corresponds to the chunk CNK3.

The row decoders 13C1 and 13C3 have the same configuration as the row decoders 13C0 and 13C2, and electrically connect to the wires GWL0 to GWL95, GSGD0 to GSGD3, and GSGS0 to GSGS3, which are connected to the corresponding chunk CNK, and the word lines WL0 to WL95, the selection gate lines SGD0 to SGD3, and the selection gate lines SGS0 to SGS3, which correspond to the selected block BLK.

The WL selection circuit 14B has the same configuration as the WL selection circuit 14A, and supplies a voltage that is to be applied to the word line WL in the selected block BLK, to the row decoder 13C1 or 13C3, according to the control signal S_SW that is transmitted from the second row control circuit 25A2.

The SG selection circuit 15B has the same configuration as the SG selection circuit 15A, and supplies a voltage that is to be applied to the selection gate lines SGD and SGS in the selected block BLK, to the row decoder 13C1 or 13C3, according to the control signal S_SW that is transmitted from the second row control circuit 25A2.

During the reading, the sense amplifier 17 senses data that is read to a plurality of bit lines BL (BL0 to BL(N−1) where N is an integer that is equal to or greater than 1). Furthermore, during the writing, the sense amplifier 17 transmits data that is to be written to the memory cell transistor through the bit line BL.

1.3 Configuration of the Memory Cell Array

Figure 3:
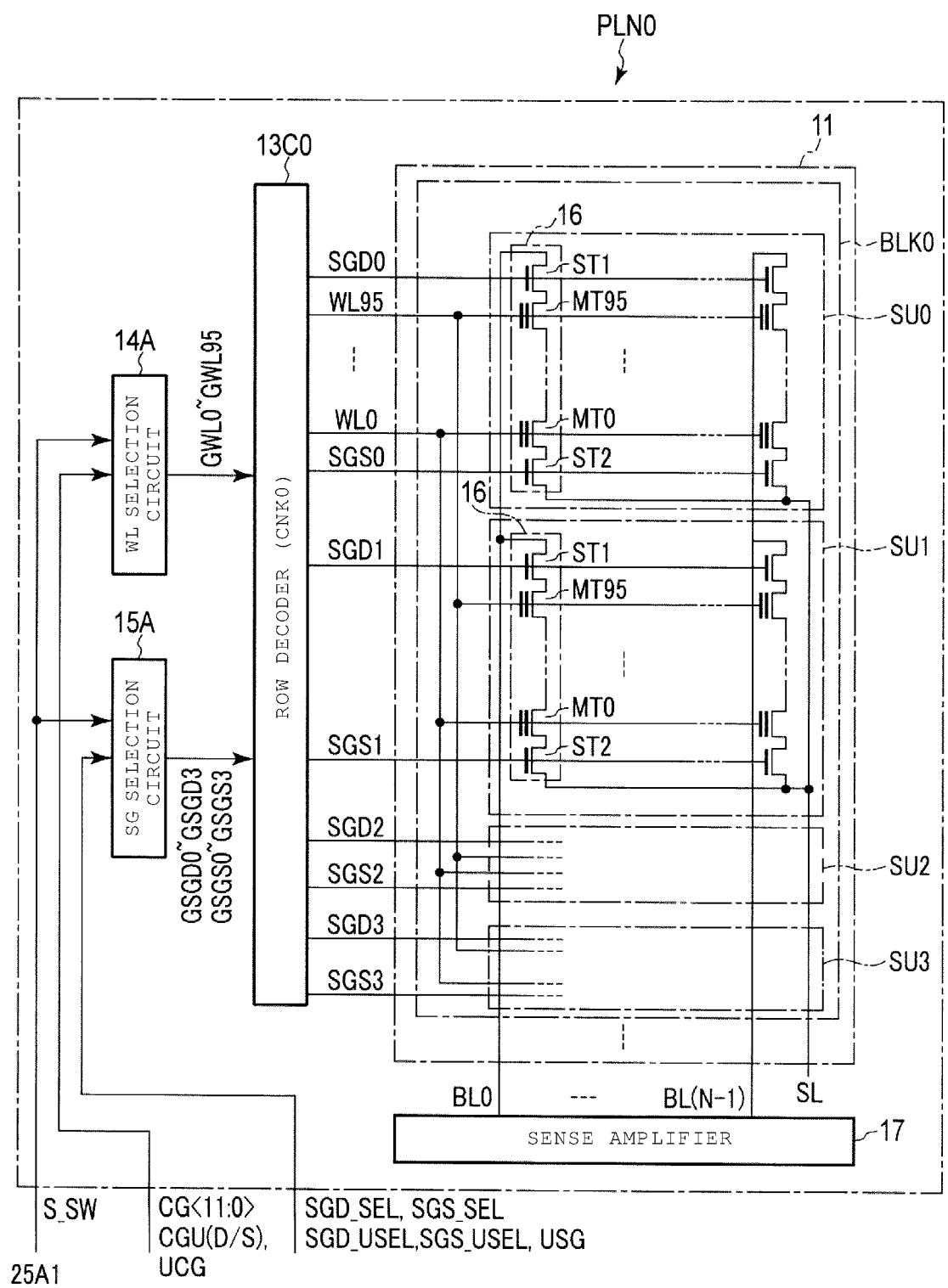
FIG. 3 is a circuit diagram illustrating a memory cell array that is included in the semiconductor memory device according to the first embodiment.

Next, a configuration of the memory cell array 11 is described with reference to FIG. 3. In an example in FIG. 3, the block BLK0, and the row decoder 13C0 in the chunk CNK0 and the sense amplifier 17, which correspond to the block BLK0 are shown. The same applies for other blocks BLK.

The block BLK0 includes a plurality of NAND strings 16 to each of which memory cell transistors MT are connected in series. Each of the NAND strings 16, for example, includes 96 memory cell transistors MT (MT0 to MT95), and selection transistors ST1 and ST2. The memory cell transistor MT includes a control gate and a charge storage layer, and retains data in a nonvolatile state. Moreover, the memory cell transistor MT may be a MONOS type that uses an insulating film in the charge storage layer, and may be an FG type that uses a conductive film in the charge storage layer. Additionally, the number of memory cell transistors MT is not limited to 96, and may be 8, 16, 32, 64, 128, or some other number.

Electric current paths for the memory cell transistors MT0 to MT95 are connected in series to one another. A drain of the memory cell transistor MT0 on the one end side of this series connection is connected to a source of the selection transistor ST1, a source of the memory cell transistor MT95 on the other end side is connected to a drain of the selection transistor ST2. Moreover, a dummy memory cell transistor MT may be provided between the selection transistor ST1 and the memory cell transistor MT95, or between the selection transistor ST2 and the memory cell transistor MT0.

A gate of the selection transistor ST1 that is present within the same string unit SU is connected in common to the same selection gate line SGD. More specifically, the gate of the selection transistor ST1 that is present within the string unit SU0 in the block BLK0 is connected in common to the selection gate line SGD0, and the gate of the selection transistor ST1 that is present in the string unit SU1 is connected in common to the selection gate line SGD1. In the same manner, the gate of the selection transistor ST1 that is present in the string unit SU2, which is not illustrated, is connected in common to the selection gate line SGD2, and the gate of the selection transistor ST1 that is present in the string unit SU3, which is not illustrated, is connected in common to the selection gate line SGD3.

Furthermore, a gate of the selection transistor ST2 that is present within the same string unit SU is connected in common to the same selection gate line SGS. More specifically, the gate of the selection transistor ST2 that is present in the string unit SU0 in the block BLK0 is connected in common to the selection gate line SGS0, and the gate of the selection transistor ST2 that is present in the string unit SU1 is connected in common to the selection gate line SGS1. In the same manner, the gate of the selection transistor ST2 that is present in the string unit SU2, which is not illustrated, is connected in common to the selection gate line SGS2, and the gate of the selection transistor ST2 that is present in the string unit SU3, which is not illustrated, is connected in common to the selection gate line SGS3.

Control gates of the memory cell transistors MT0 to MT95 in each of the NAND strings 16 that are present within the same block BLK are connected in common to other word lines WL0 to WL95, respectively.

Furthermore, among the NAND strings 16 that are arranged in a matrix layout within the memory cell array 11, a drain of the selection transistor ST1 in the NAND string 16 in the same column is connected to one of bit lines BL (BL0 to BL (N−1)). That is, the bit line BL connects in common to the NAND string 16 across string units SU and the blocks BLK within a plurality of chunks CNK. Furthermore, a source of the selection transistor ST2 that is present within each chunk CNK is connected in common to a source line SL. In addition, the source line SL, for example, connects in common to the NAND string 16 across the plurality of chunks CNK. Moreover, the source lines SL in the planes PLN 0 and PLN 1 are connected in common, and may be connected to a source line driver (not illustrated), but alternatively, may be connected to a different source line driver for every plane PLN.

Data writing and reading are collectively performed on the memory cell transistor MT that is connected to one of the word lines WL in any one of the string units SU. This unit is referred to as a "page".

Moreover, a unit of data erasure is not limited to one block BLK. A plurality of blocks BLK may be collectively erased. One or several areas of one block BLK may be collectively erased.

An erasing method, for example, is disclosed in U.S. patent application Ser. No. 13/235,389, filed on Sep. 18, 2011, which is entitled "NONVOLATILE SEMICONDUCTOR MEMORY DEVICE." An additional erasing method is disclosed in U.S. patent application Ser. No. 12/694,690, filed on Jan. 27, 2010, which is entitled "NON-VOLATILE SEMICONDUCTOR STORAGE DEVICE." Additionally, another erasing method is disclosed in U.S. patent application Ser. No. 13/483,610, filed on May 30, 2012, which is entitled "NONVOLATILE SEMICONDUCTOR MEMORY DEVICE AND DATA ERASE METHOD THEREOF." The entire contents of all of these patent applications are incorporated by reference herein.

Additionally, although in the present example, the case where the memory cell transistors MT are stacked in three dimensions on the semiconductor substrate is described; in some cases, the memory cell transistors MT may be arranged on the semiconductor substrate in two dimensions.

Examples of three-dimensional stacked NAND flash memory configuration is disclosed in U.S. patent application Ser. No. 12/407,403, filed on Mar. 19, 2009, which is entitled "THREE DIMENSIONAL STACKED NON-VOLATILE SEMICONDUCTOR MEMORY," in U.S. patent application Ser. No. 12/406,524, filed on Mar. 18, 2009, which is entitled "THREE DIMENSIONAL STACKED NONVOLATILE SEMICONDUCTOR MEMORY," U.S. patent application Ser. No. 12/679,991, filed on Mar. 25, 2010, which is entitled "NON-VOLATILE SEMICONDUCTOR STORAGE DEVICE AND METHOD OF MANUFACTURING THE SAME," and U.S. patent application Ser. No. 12/532,030, filed on Mar. 23, 2009, which is entitled "SEMICONDUCTOR MEMORY AND METHOD FOR MANUFACTURING SAME." The entire contents of these patent applications are incorporated by reference herein.

1.4 Configuration of the Cross Section of the Memory Cell Array

Figure 4:
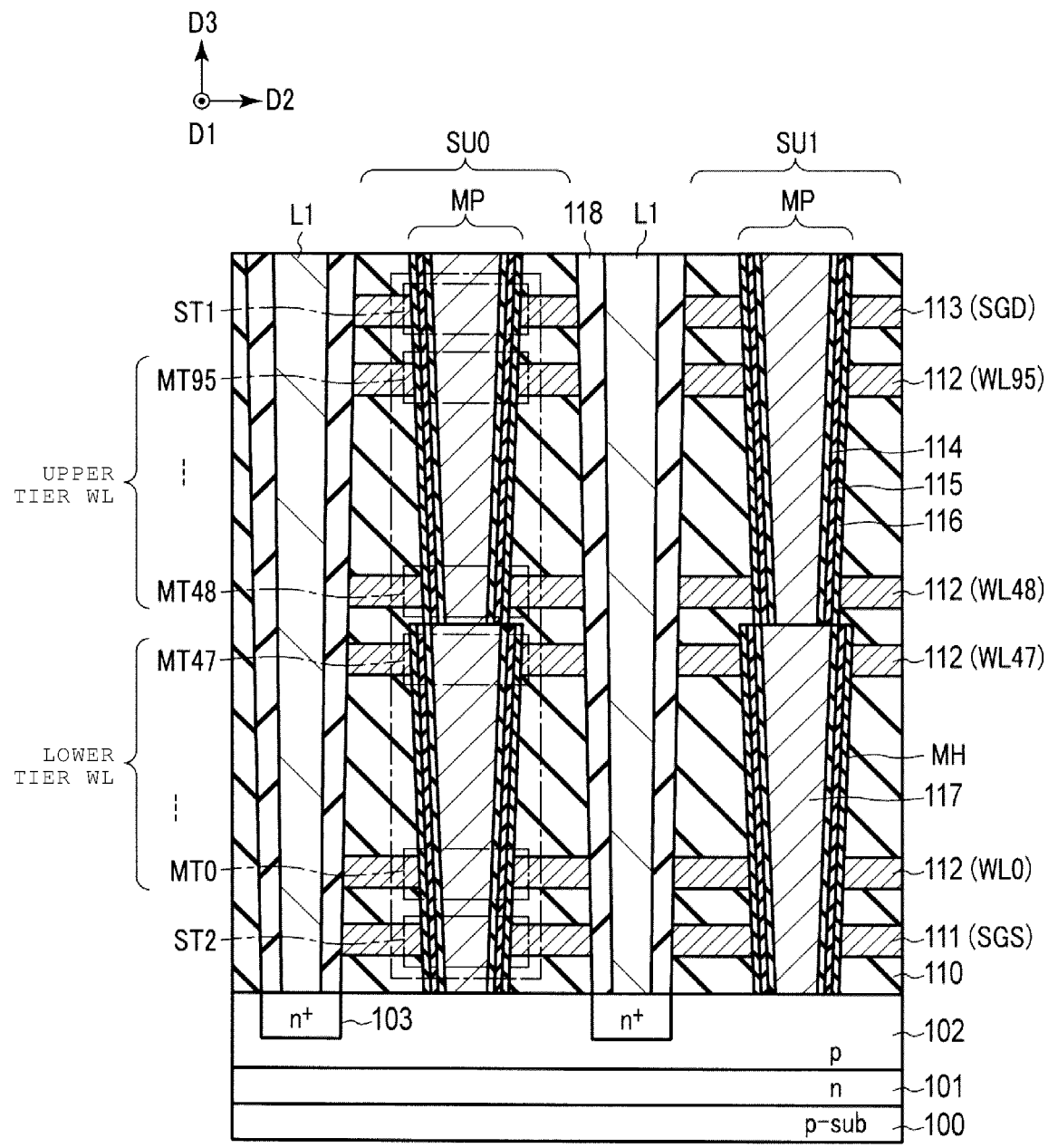
FIG. 4 is a cross-sectional diagram illustrating a memory cell array that is included in the semiconductor memory device according to the first embodiment.

Next, a configuration of the cross section of the memory cell array 11 is described with reference to FIG. 4. The configuration of the cross section of the memory cell array 11 is the same as the configuration of each of the planes PLN0 and PLN1. FIG. 4 is a cross-sectional diagram illustrating a result of cutting a source line contact LI, and the NAND strings 16 in the string units SU0 and SU1 in the direction perpendicular to the direction in which the word line WL extends. Moreover, although in an example in FIG. 4, a case where a plurality of NAND strings 16 are arranged in one column along a first direction D1 in one string unit SU is illustrated for brevity, it is possible that an arrangement of the NAND strings 16 along the first direction D1 in one string unit SU is configured in various ways. For example, along the first direction D1, the NAND strings 16 may be arranged in parallel in two columns, or may be arranged in a zigzag manner in four columns.

As illustrated in FIG. 4, an insulating layer 118 is provided on a side surface of the source line contact LI. Then, one string unit SU is positioned between two source line contacts LI, with the insulating layer 118 being interposed so that the source line contact LI and wiring layers 111, 112, and 113 are not electrically connected to one another.

In each string unit SU, the NAND string 16 is formed along a third direction D3 perpendicular to a semiconductor substrate 100. More specifically, an n-type well 101 is provided on a surface area of the semiconductor substrate 100, and a p-type well 102 is provided on a surface area of the n-type well 101. Furthermore, an $n^+$ type diffusion layer 103 is provided on a surface area of the p-type well 102. An insulating layer 110 is provided on the semiconductor substrate 100, and the wiring layer 111 that functions as the selection gate line SGS, the wiring layers 112 including 96 layers that function as the word lines WL0 to WL95, and the wiring layer 113 that functions as the selection gate line SGD are sequentially stacked. The insulating layer 110 is provided between each adjacent pair of the wiring layers 111, 112, and 113. For example, a silicon oxide film is used for the insulating layer 110. Alternatively, the plurality of wiring layers 111 and 113 may be provided.

A memory pillar that passes through the wiring layers 111, 112, and 113 and a plurality of insulating layers 110 and reaches the p-type well 102 is provided per NAND string 16. The memory pillar includes two sections that are stacked along the third direction D3. More specifically, a memory pillar section MP1 is provided to pass through the wiring layer 111 which corresponds to the selection gate line SGS, the wiring layers 112 which correspond to the word lines WL0 to WL47 and the plurality of insulating layers 110, and connects to the semiconductor substrate 100. In addition, a memory pillar section MP2 is provided to pass through the wiring layers 112 which correspond to the word lines WL48 to WL95, the wiring layer 113 which corresponds to the selection gate line SGD, and the plurality of insulating layers 110, and is connected to the upper surface of the memory pillar MP1. In the example in FIG. 3, diameters of the upper regions of the memory pillars MP1 and MP2 are greater than those of the bottom regions thereof. Accordingly, an angle that a side surface of the pillar makes with respect to a plane surface of the semiconductor substrate 100 is less than 90 degrees (this shape is hereinafter referred to as a "tapered shape"). Moreover, the shape of the memory pillar is not limited to the tapered shape. For example, the memory pillar may have a columnar shape of which a diameter is the same from a top region to a bottom region, and a diameter of the bottom region may be greater than a diameter of the upper region. Additionally, the structure in which two memory pillar sections are stacked up is described. However, a structure in which one memory pillar section is provided may be employed and a structure in which three or more memory pillar sections are stacked may be employed. The memory pillar sections MP1 and MP2, are hereinafter simply referred to as a "memory pillar MP" when they do not need to be distinguished from each other.

A block insulating film 116, a charge storage layer 115, and a tunnel insulating film 114 are staked in this order on a side surface of the memory pillar MP, and a semiconductor layer 117 is within the memory pillar MP. For example, a silicon oxide film is used for the block insulating film 116 and the tunnel insulating film 114. For example, a silicon nitride film is used for the charge storage layer 115. For example, polycrystalline silicon is used for the semiconductor layer 117. The semiconductor layer 117 within the memory pillar MP is an area in which a channel is formed when the memory cell transistor MT and the selection transistors ST1 and ST2 are turned on.

With the memory pillar MP and the word lines WL0 to WL95 (the wiring layer 112), the memory cell transistors MT0 to MT95 are formed. In the same manner, with the memory pillar MP and the selection gate lines SGD (the wiring layer 113) and SGS (the wiring layer 111), the selection transistors ST1 and ST2 are formed, respectively. The upper surface of the memory pillar MP2 is connected to the bit line BL (not illustrated). According to the present embodiment, a group of the word lines WL0 to WL47 is defined as a lower layer WL group, and a group of the word lines WL48 to WL95 is defined as an upper layer WL group.

Furthermore, the source line contact LI has a linear shape along the first direction D1. For example, polycrystalline silicon is used for the source line contact LI. The bottom surface of the source line contact LI is connected to the n⁺ the diffusion layer 103, and the upper surface thereof is connected to the source line SL (not illustrated). Furthermore, the insulating layer 118 is provided on the side surface of the source line contact LI so that the source line contact LI and the wiring layers 111, 112, and 113 are not electrically connected to one another. For example, a silicon oxide film is used for the insulating layer 118.

1.5 Configuration of the Row Decoder

Figure 5:
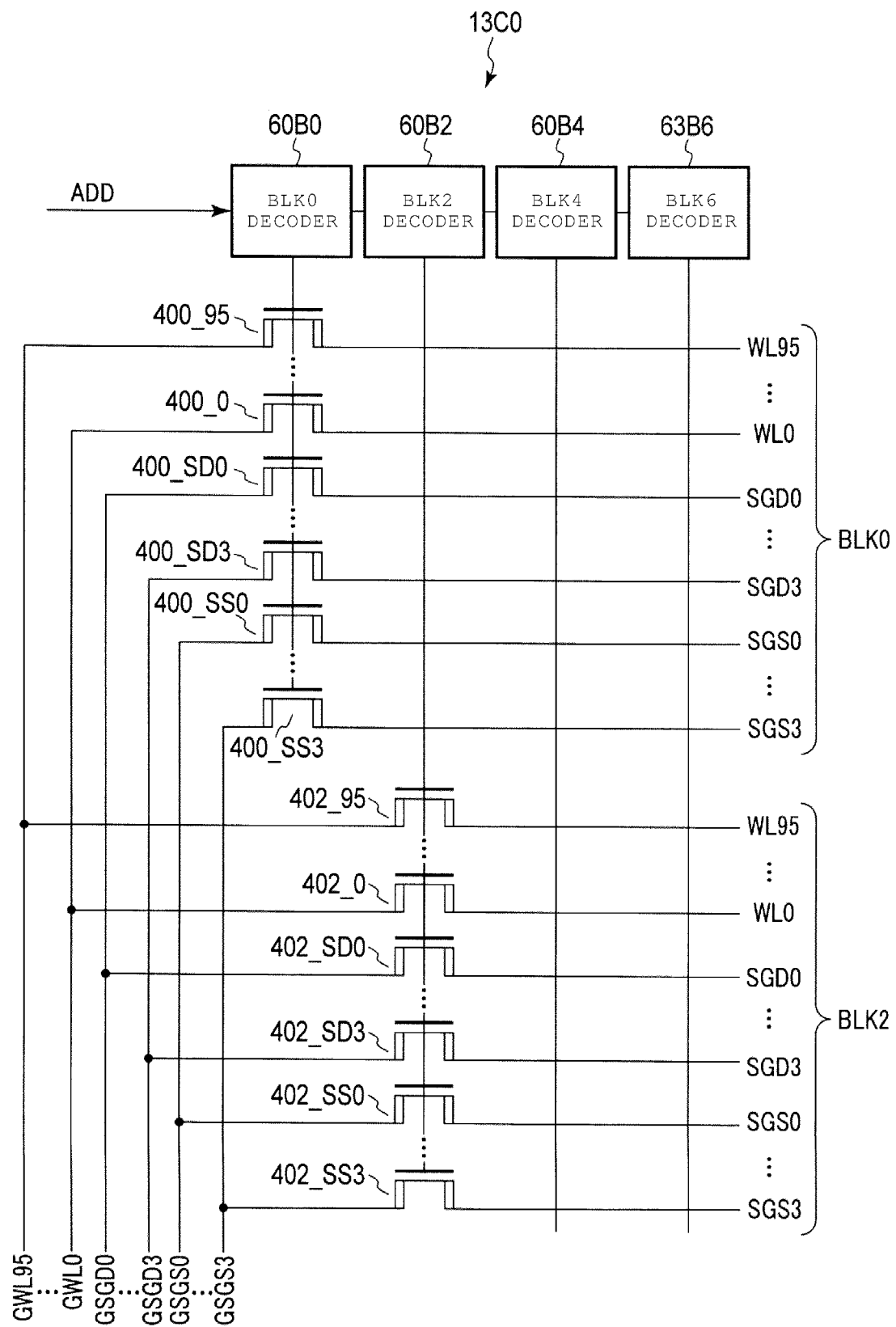
FIG. 5 is a circuit diagram illustrating a row decoder that is included in the semiconductor memory device according to the first embodiment.

Next, a configuration of the row decoder is described with reference to FIG. 5. Although in an example in FIG. 5, the row decoder 13C0 is illustrated, the other row decoders have the same configuration as well. Furthermore, although the example in FIG. 5, only the transistors that correspond to the blocks BLK0 and BLK2 are illustrated, the transistors that correspond to the blocks BLK4 and BLK6 have the same configuration as well. In the following description, one of the source and the drain of the transistor may be referred to as a "one end of the transistor" and the other of the source and the drain of the transistor may be referred to as the "other end of the transistor" or simply as the "other end.".

As illustrated, the row decoder 13C0 includes block decoders 60 (60B0, 60B2, 60B4, and 60B6), high breakdown voltage n channel MOS transistors 400 (400_0 to 400_95, 400_SD0 to 400_SD3, and 400_SS0 to 400_SS3), and high breakdown voltage n channel MOS transistors 402 (402_0 to 402_95, 402_SD0 to 402_SD3, and 402_SS0 to 402_SS3).

Each block decoder 60 decodes the address information ADD (for example, the block address). Then, each block decoder 60 controls ON and OFF states of the corresponding transistor according to a result of the decoding, and electrically connects the wires GWL0 to GWL95, GSGD0 to GSGD3, and GSGS0 to GSGS3, respectively to the word lines WL0 to WL95 and the selection gate lines SGD0 to SGD3 and SGS0 to SGS3 in the corresponding block BLK.

More specifically, if the block BLK0 is selected, the block decoder 60B0 (BLK0 decoder in FIG. 5) causes the transistors 400 (400_0 to 400_95, 400_SD0 to 400_SD3, and 400_SS0 to 400_SS3) to be in the ON state. Furthermore, if the block BLK2 is selected, the block decoder 60B2 (BLK2 decoder in FIG. 5) causes the transistors 402 (402_0 to 402_95, 402_SD0 to 402_SD3, and 402_SS0 to 402_SS3) to be in the ON state. In the same manner, the block decoder 60B4 (BLK4 decoder in FIG. 5) and the block decoder 60B6 (BLK6 decoder in FIG. 5) correspond to the block BLK4 and BLK6, respectively.

The transistors 400_0 to 400_95 function as switching elements that connect the wires GWL0 to GWL95, and the word lines WL0 to WL95 in the corresponding block BLK, to one another, respectively. One end of the transistors 400_0 to 400_95 is connected to each of the word lines WL0 to WL95 in the corresponding block BLK0, and the other end thereof is connected to each of the wires GWL0 to GWL95. Furthermore, gates of the transistors 400_0 to 400_95 are connected in common to the block decoder 60B0.

The transistors 400_SD0 to 400_SD3 function as switching elements that connect the wires GSGD0 to GSGD3, and the selection gate lines SGD0 to SGD3 in the corresponding BLK0, to one another, respectively. One end of the transistors 400_SD0 to 400_SD3 is connected to each of the selection gate lines SGD0 to SGD3 in the corresponding block BLK0, and the other end thereof is connected to each of the wires GSGD0 to GSGD3. Furthermore, gates of the transistors 400_SD0 to 400_SD3 are connected in common to the block decoder 60B0.

The transistors 400_SS0 to 400_SS3 function as switching elements that connect the wires GSGS0 to GSGS3, and the selection gate lines SGS0 to SGS3 in the corresponding BLK0, to one another, respectively. One end of the transistors 400_SS0 to 400_SS3 is connected to each of the selection gate lines SGS0 to SGS3 in the corresponding block BLK0, and the other end thereof is connected to each of the wires GSGS0 to GSGS3. Furthermore, gates of the transistors 400_SS0 to 400_SS3 are connected to the block decoder 60B0.

Moreover, for example, a transistor may be provided that connects a grounding voltage (VSS) wire to each of the selection gate lines SGD0 to SGD3 and SGS0 to SGS3 in the corresponding block BLK0. In this case, an inversion signal of the block decoder 60B0 is input into a gate of each transistor.

The transistor 402 has the same configuration as the transistor 400.

One end of the transistors 402_0 to 402_95 is connected to each of the word lines WL0 to WL95 in the corresponding block BLK2, and the other end thereof is connected to each of the wires GWL0 to GWL95. Furthermore, gates of the transistors 402_0 to 402_95 are connected in common to the block decoder 60B2.

One end of the transistors 402_SD0 to 402_SD3 is connected to each of the selection gate lines SGD0 to SGD3 in the corresponding block BLK2, and the other end thereof is connected to each of the wires GSGD0 to GSGD3.

Furthermore, gates of the transistors 402_SD0 to 402_SD3 are connected in common to the block decoder 60B2.

One end of the transistors 402_SS0 to 402_SS3 is connected to each of the selection gate lines SGS0 to SGS3 in the corresponding block BLK2, and the other end thereof is connected to each of the wires GSGS0 to GSGS3. Furthermore, gates of the transistors 402_SS0 to 402_SS3 are connected to the block decoder 60B2.

1.6 Configuration of the WL Selection Circuit

Next, a configuration of the WL selection circuit 14A is described.

1.6.1 Configuration of the WL Selection Circuit

Figure 7:
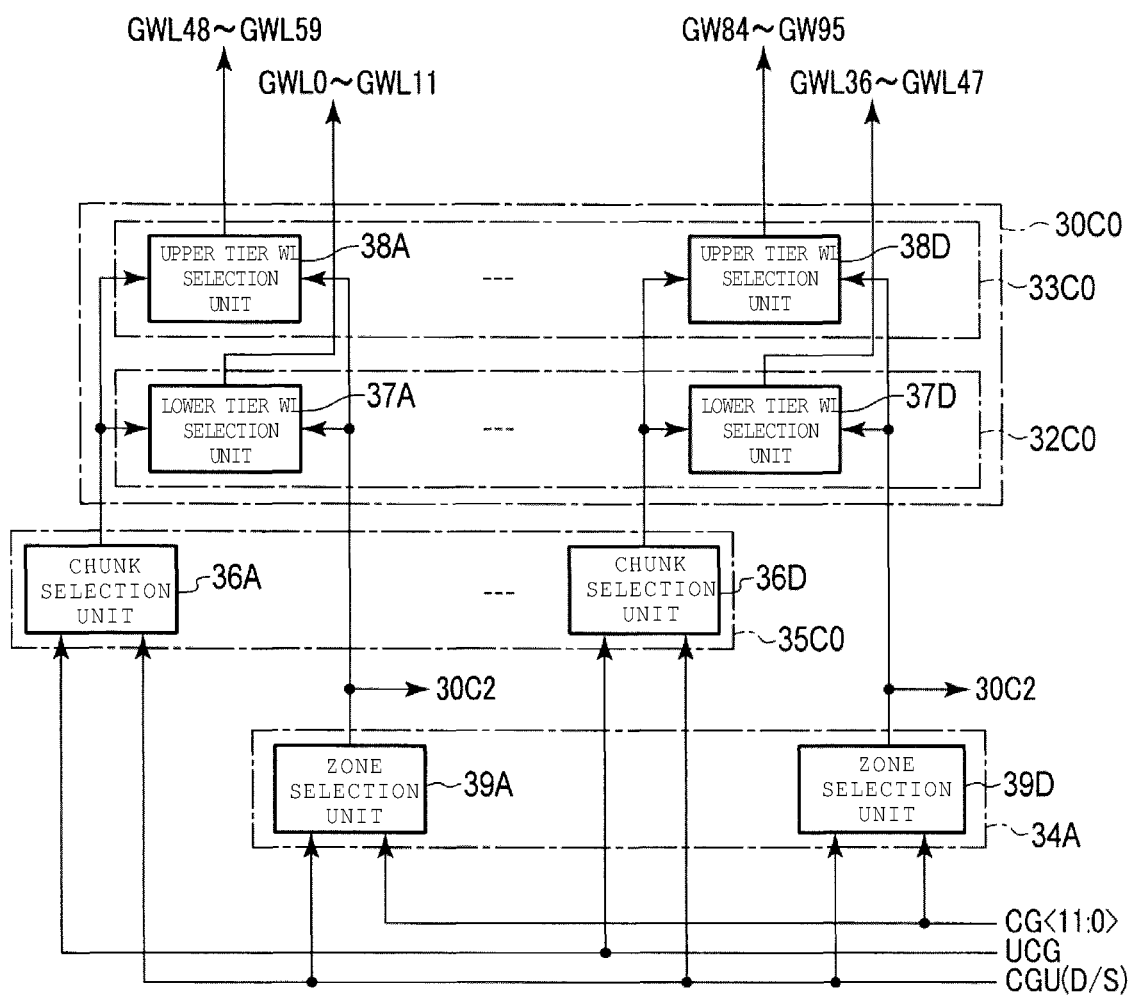
FIG. 7 is a block diagram illustrating a zone selection circuit, a chunk selection circuit, a lower layer WL selection circuit, and an upper layer WL selection circuit that are included in the semiconductor memory device according to the first embodiment.
Figure 8:
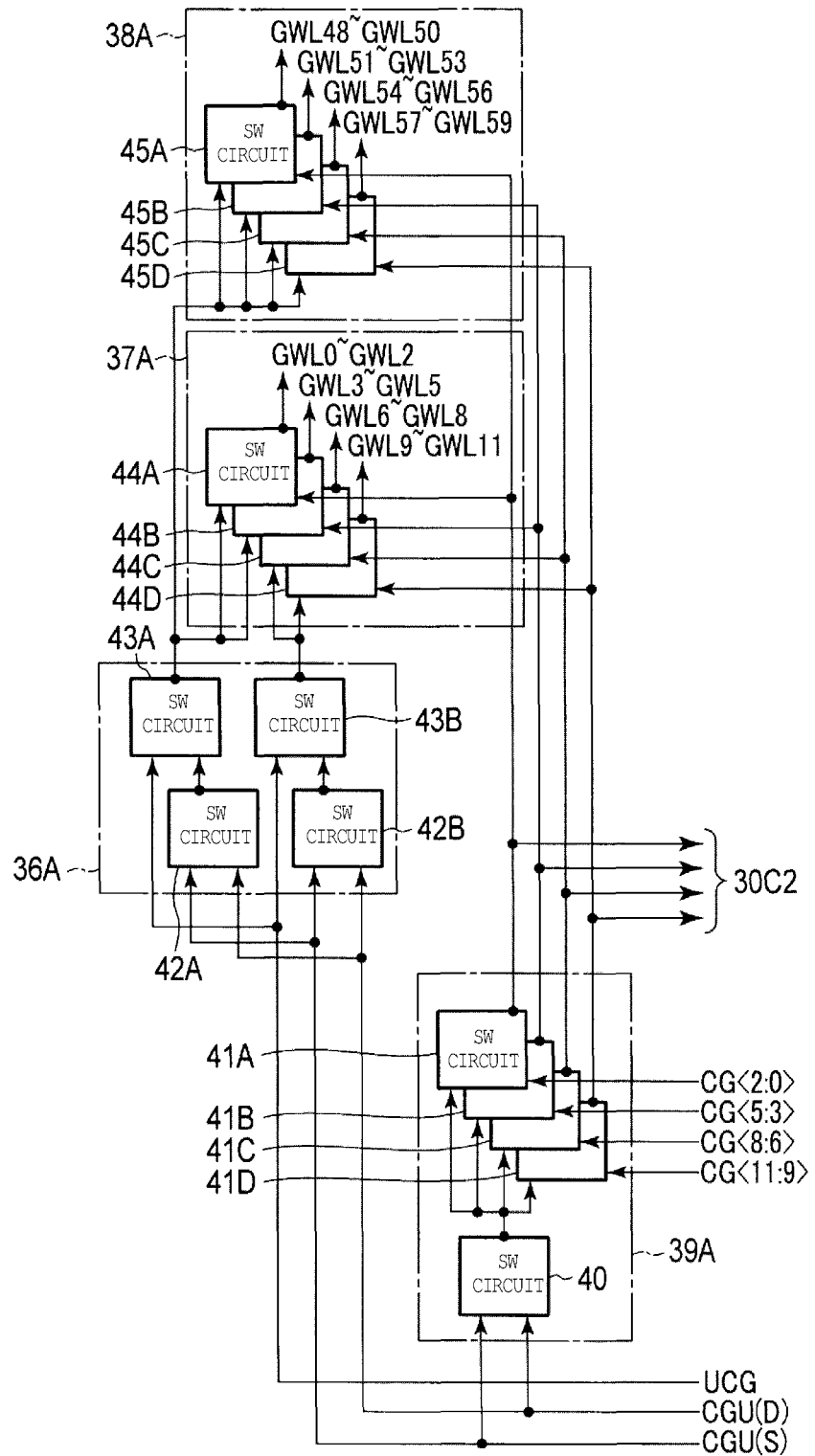
FIG. 8 is a block diagram illustrating the zone selection unit, the chunk selection unit, the lower layer WL selection unit, and the upper layer WL selection unit that are included in the semiconductor memory device according to the first embodiment.

First, a configuration of the WL selection circuit 14A is described with reference to FIGS. 6 to 8. Although FIGS. 6 to 8 illustrate the WL selection circuit 14A, the WL selection circuit 14B has the same configuration as well.

Figure 6:
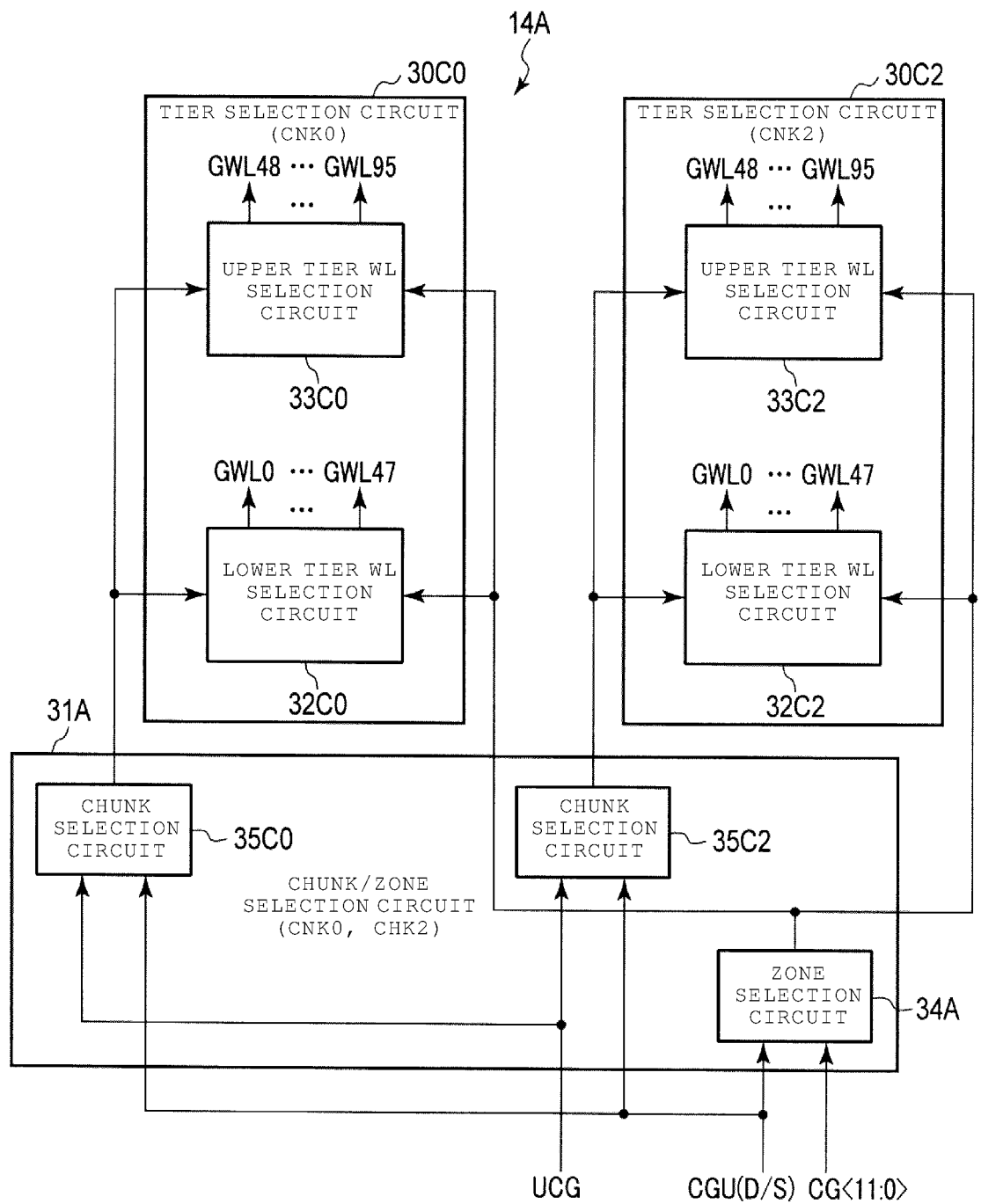
FIG. 6 is a block diagram illustrating a WL selection circuit that is included in the semiconductor memory device according to the first embodiment.

FIG. 6 is a schematic diagram illustrating the configuration of the WL selection circuit 14A. As illustrated in FIG. 6, the WL selection circuit 14A generally includes a layer selection circuit 30C0 that corresponds to the chunk CNK0, a layer selection circuit 30C2 that corresponds to the chunk CNK2, and a chunk/zone selection circuit 31A that corresponds to the chunks CNK0 and CNK2.

Based on the control signal S_SW that is transmitted from the first row control circuit 25A1, the chunk/zone selection circuit 31A outputs voltages of the wires CG<11:0>, CGU (D/S), and UCG to the layer selection circuits 30C0 and 30C2. The chunk/zone selection circuit 31A includes a zone selection circuit 34A, and chunk selection circuits 35C0 and 35C2.

A plurality of input terminals of the zone selection circuit 34A are connected to the wires CG<11:0> and CGU(D/S). A plurality of output terminals of the zone selection circuit 34A are connected in common to a lower layer WL selection circuit 32C0 and an upper layer WL selection circuit 33C0 of the layer selection circuit 30C0, and a lower layer WL selection circuit 32C2 and an upper layer WL selection circuit 33C2 of the layer selection circuit 30C2. If the first row selection circuit 12A selects any one of the corresponding plurality of chunks CNK (CNK0 and CNK2), the zone selection circuit 34A selects a plurality of zones Zn that corresponds to the selected word line WL. Then, the zone selection circuit 34A outputs the voltages of the wires CG<11:0> and CGU(D/S) to the layer selection circuits 30C0 and 30C2, according to the selected zones Zn.

According to the present embodiment, a set of three word lines WL is defined as one zone Zn. Therefore, 32 zones Zn0 to Zn31 are provided corresponding to 96 word lines WL0 to WL95. More specifically, the zone Zn0 includes the word lines WL0 to WL2. The zone Zn1 includes the word lines WL3 to WL5 and the zone Zn2 includes the word lines WL6 to WL8. In the same manner, the zone Zn31 includes the word lines WL93 to WL95. The zone selection circuit 34A selects four consecutive zone Zn that corresponds to the selected word line WL. More specifically, for example, if the word line WL10 is selected, the word line WL is included in the zone Zn3. In this case, the zone selection circuit 34A outputs the voltage of the wire CG<11:0> to layer selection circuits 30C0 and 30C2, corresponding to four consecutive selection zones Zn (for example, the zones Zn2 to Zn5) that include the zone Zn3. Furthermore, the zone selection circuit 34A outputs the voltage of the wire CGU (D/S) to the layer selection circuits 30C0 and 30C2, corresponding to a non-selected zone Zn.

Moreover, the zone selection circuit 34A according to the present embodiment corresponds to a plurality of chunks CNK (e.g., CNK0 and CNK2), but is not limited to this. For example, one zone selection circuit 34 may be provided for each chunk CNK.

A plurality of input terminals of the chunk selection circuit 35C0 are connected to the wire UCG or CGU (D/S), and an output terminal thereof is connected in common to the layer selection circuits 30C0 and 30C2. If the selected block BLK is included in the corresponding chunk CNK0, the chunk selection circuit 35C0 outputs the voltage of the wire CGU (D/S) to the layer selection circuit 30C0. On the other hand, if the selected block BLK is not included in the corresponding chunk CNK0, the chunk selection circuit 35C0 outputs a voltage of the wire UCG to the layer selection circuit 30C0.

The chunk selection circuit 35C2 has the same configuration as the chunk selection circuit 35C0, and corresponds to the chunk CNK2.

Based on the control signal S_SW that is transmitted from the first row control circuit 25A1, the layer selection circuit 30C0 outputs any one of output voltages of the zone selection circuit 34A and the chunk selection circuit 35C0 to the wire GWL0 to GWL95 that correspond to the word lines WL0 to WL95, respectively, of the chunk CNK0. The layer selection circuit 30C0 includes the lower layer WL selection circuit 32C0 and the upper layer WL selection circuit 33C0.

A plurality of input terminals of the lower layer WL selection circuit 32C0 are connected to the zone selection circuit 34A or the chunk selection circuit 35C0, and a plurality of output terminals thereof are connected to the wires GWL0 to GWL47, respectively. For example, if the selected block BLK is included in the corresponding chunk CNK0 and the selected word line WL is included in a lower layer WL group, the lower layer WL selection circuit 32C0 outputs the output voltage of the zone selection circuit 34A to the wires GWL0 to GWL47. On the other hand, for example, if the selected word line WL is not included in the lower layer WL group, the lower layer WL selection circuit 32C0 outputs the output voltage of the chunk selection circuit 35C0 to the wires GWL0 to GWL47.

A plurality of input terminals of the upper layer WL selection circuit 33C0 are connected to the zone selection circuit 34A or the chunk selection circuit 35C0, and a plurality of output terminals thereof are connected to the wires GWL48 to GWL95, respectively. For example, if the selected block BLK is included in the corresponding chunk CNK0 and the selected word line WL is included in an upper layer WL group, the upper layer WL selection circuit 33C0 outputs the output voltage of the zone selection circuit 34A to the wires GWL48 to GWL95. On the other hand, for example, if the selected word line WL is not included in the upper layer WL group, the upper layer WL selection circuit 33C0 outputs the output voltage of the chunk selection circuit 35C0 to the wires GWL48 to GWL95.

The layer selection circuit 30C2 has the same configuration as the layer selection circuit 30C0, and corresponds to the chunk CNK2. Then, the layer selection circuit 30C2 includes the lower layer WL selection circuit 32C2 and the upper layer WL selection circuit 33C2.

The lower layer WL selection circuit 32C2 has the same configuration as the lower layer WL selection circuit 32C0, and outputs any one of the output voltage of the zone selection circuit 34A and an output voltage of the chunk selection circuit 35C2 to the wires GWL0 to GWL47 that correspond to the chunk CNK2.

The upper layer WL selection circuit 33C2 has the same configuration as the upper layer WL selection circuit 33C0, and outputs any one of the output voltages of the zone selection circuit 34A and the chunk selection circuit 35C2 to the wires GWL48 to GWL95 that correspond to the chunk CNK2.

1.6.2 Configuration of the Zone Selection Circuit

Next, a configuration of the zone selection circuit 34A is described with reference to FIG. 7.

As illustrated in FIG. 7, each of the zone selection circuit 34A, the chunk selection circuit 35C0, and the layer selection circuit 30C0 is divided into four selection units, corresponding to the word lines WL0 to WL95.

The zone selection circuit 34A includes four zone selection units 39A to 39D. The zone selection units 39A to 39D are hereinafter generally referred to as a "zone selection unit 39". Moreover, the number of zone selection units is not limited to four.

The zone selection unit 39A corresponds to the zones Zn0 to Zn3 (the word lines WL0 to WL11) and the zones Zn16 to Zn19 (the word lines WL48 to WL59) in the chunks CNK0 and CNK2. An output terminal of the zone selection unit 39A is connected in common to a lower layer WL selection unit 37A and an upper layer WL selection unit 38A of the layer selection circuits 30C0 and 30C2. If any one of the zones Zn0 to Zn3 that correspond to the word lines WL0 to WL11 or the zones Zn16 to Zn19 that correspond to the word lines WL48 to WL59 in the chunks CNK0 and CNK2 is selected, the zone selection unit 39A outputs the voltage of the wire CG<11:0> to the lower layer WL selection unit 37A and the upper layer WL selection unit 38A of the layer selection circuits 30C0 and 30C2. On the other hand, if the zone Zn is non-selected, the voltage of the wire CGU (D/S) is output to the lower layer WL selection units 37A and the upper layer WL selection unit 38A of the layer selection circuits 30C0 and 30C2.

Zone selection units 39B to 39D have the same configuration as the zone selection unit 39A. The zone selection unit 39B corresponds to the zones Zn4 to Zn7 (the word lines WL12 to WL23) and the zones Zn20 to Zn23 (the word lines WL60 to WL71) in the chunks CNK0 and CNK2. The zone selection unit 39C corresponds to the zones Zn8 to Zn11 (the word lines WL24 to WL35) and the zones Zn24 to Zn27 (the word lines WL72 to WL83) in the chunks CNK0 and CNK2. The zone selection unit 39D corresponds to the zones Zn12 to Zn15 (the word lines WL36 to WL47) and the zones Zn28 to Zn31 (the word lines WL84 to WL95) in the chunks CNK0 and CNK2.

1.6.3 Configuration of the Chunk Selection Circuit

Next, a configuration of the chunk selection circuit 35C0 is described referring back to FIG. 7.

As illustrated in FIG. 7, the chunk selection circuit 35C0 includes four chunk selection units 36A to 36D. The chunk selection units 36A to 36D are hereinafter generally referred to as a "chunk selection unit 36". Moreover, the number of chunk selection units is not limited to four.

The chunk selection unit 36A corresponds to the wires GWL0 to GWL11 and GWL48 to GWL59 in the chunk CNK0. An output terminal of the chunk selection unit 36A is connected in common to the lower layer WL selection unit 37A and the upper layer WL selection unit 38A of the layer selection circuit 30C0. If the corresponding block BLK is selected, the chunk selection unit 36A outputs the voltage of the wire CGU (D/S) to the lower layer WL selection unit 37A and the upper layer WL selection unit 38A. On the other hand, if the corresponding block BLK is not selected, the chunk selection unit 36A outputs the voltage of the wire UCG to the lower layer WL selection unit 37A and the upper layer WL selection unit 38A.

Chunk selection units 36B to 36D have the same configuration as the chunk selection unit 36A. The chunk selection unit 36B corresponds to the wires GWL12 to GWL23 and GWL60 to GWL71 in the chunk CNK0. The chunk selection unit 36C corresponds to the wires GWL24 to GWL35 and GWL72 to GWL83 in the chunk CNK0. The chunk selection unit 36D corresponds to the wires GWL36 to GWL47 and GWL84 to GWL95 in the chunk CNK0.

1.6.4 Configuration of the Layer Selection Circuit

Next, a configuration of the layer selection circuit 30C0 is described referring back to FIG. 7.

As illustrated in FIG. 7, the lower layer WL selection circuit 32C0 includes four lower layer WL selection units 37A to 37D. The lower layer WL selection units 37A to 37D are hereinafter generally referred to as a "lower layer WL selection unit 37". Moreover, the number of lower layer WL selection units is not limited to four.

An output terminal of the lower layer WL selection unit 37A is connected to the wires GWL0 to GWL11 in the chunk CNK0. If the selected word line WL is included in the lower layer WL group in the chunk CNK0, the lower layer WL selection unit 37A outputs an output voltage of the zone selection unit 39A to the wires GWL0 to GWL11. On the other hand, if the selected word line WL is not included in the lower layer WL group in the chunk CNK0, the lower layer WL selection unit 37A outputs an output voltage of the chunk selection unit 36A to the wires GWL0 to GWL11.

Lower layer WL selection units 37B to 37D have the same configuration as the lower layer WL selection unit 37A. The lower layer WL selection unit 37B is connected to the wires GWL12 to GWL23 in the chunk CNK0. The lower layer WL selection unit 37C is connected to the wires GWL24 to GWL35 in the chunk CNK0. The lower layer WL selection unit 37D is connected to the wires GWL36 to GWL47 in the chunk CNK0.

The upper layer WL selection circuit 33C0 includes four upper layer WL selection units 38A to 38D. The upper layer WL selection units 38A to 38D are hereinafter generally referred to as an "upper layer WL selection unit 38". Moreover, the number of upper layer WL selection units is not limited to four.

An output terminal of the upper layer WL selection unit 38A is connected to the wires GWL48 to GWL59 in the chunk CNK0. If the selected word line WL is included in the upper layer WL group in the chunk CNK0, the upper layer WL selection unit 38A outputs the output voltage of the zone selection unit 39A to the wires GWL48 to GWL59. On the other hand, if the selected word line WL is not included in the upper layer WL group in the chunk CNK0, the upper layer WL selection unit 38A outputs the output voltage of the chunk selection unit 36A to the wires GWL48 to GWL59.

Upper layer WL selection units 38B to 38D have the same configuration as the upper layer WL selection unit 38A. The upper layer WL selection unit 38B is connected to the wires GWL60 to GWL71 in the chunk CNK0. The upper layer WL selection unit 38C is connected to the wires GWL72 to GWL83 in the chunk CNK0. The upper layer WL selection unit 38D is connected to the wires GWL84 to GWL95 in the chunk CNK0.

1.6.5 Configuration of the Zone Selection Unit

Next, a configuration of the zone selection unit 39A is described with reference to FIG. 8.

As illustrated in FIG. 8, the zone selection unit 39A includes switch (SW) circuits 40 and 41 (41A to 41D).

The switch circuit 40 includes two input terminals and one output terminal. The two input terminals of the switch circuit 40 are connected to the wire CGU(D) and the wire CGU(S), respectively, and the output terminal is connected to the switch circuits 41A to 41D. The switch circuit 40 outputs any one of voltages of the wire CGU(D) and the wire CGU(S) to switch circuits 41A to 41D.

The switch circuit 41 corresponds to one zone Zn that is included in the lower layer WL group and one zone Zn that is included in the upper layer WL group. Therefore, based on zone information of the lower layer WL group that includes the selected word line WL or of the upper layer WL group that includes the selected word line WL, the first row control circuit 25A1 controls the switch circuit 41.

More specifically, the switch circuit 41A corresponds to the zones Zn0 (the word lines WL0 to WL2) and Zn16 (the word lines WL48 to WL50) in the chunks CNK0 and CNK2. The switch circuit 41A includes four input terminals and three output terminals. Among the four input terminals of the switch circuit 41A, one input terminal is connected to an output terminal of the switch circuit 40, and each of the other three input terminals is connected to a wire CG<2:0>. Each output terminal of the switch circuit 41A is connected in common to an input terminal of a switch circuit 44A of the lower layer WL selection unit 37A of the layer selection circuits 30C0 and 30C2 and to an input terminal of a switch circuit 45A of the upper layer WL selection unit 38A. For example, if any one of the zone Zn0 and the zone Zn16 is selected in the chunks CNK0 and CNK2, the switch circuit 41A outputs a voltage of the wire CG<2:0> from the three output terminals. Furthermore, if the zone Zn0 and the zone Zn16 in the chunks CNK0 and CNK2 are non-selected, the switch circuit 41A outputs an output voltage of the switch circuit 40, that is, any one of the voltages of the wires CGU(D) and CGU(S), from the three output terminals.

Switch circuits 41B to 41D have the same configuration as the switch circuit 41A.

The switch circuit 41B corresponds to the zones Zn1 (the word lines WL3 to WL5) and Zn17 (the word lines WL51 to WL53) in the chunks CNK0 and CNK2. Among four input terminals of the switch circuit 41B, one input terminal is connected to the output terminal of the switch circuit 40, and each of the other three input terminals is connected to a wire CG<5:3>. Each output terminal of the switch circuit 41B is connected in common to an input terminal of a switch circuit 44B of the lower layer WL selection unit 37A of the layer selection circuits 30C0 and 30C2 and an input terminal of a switch circuit 45B of the upper layer WL selection unit 38A.

A switch circuit 41C corresponds to the zones Zn2 (the word lines WL6 to WL8) and Zn18 (the word lines WL54 to WL56) in the chunks CNK0 and CNK2. Among four input terminals of the switch circuit 41C, one input terminal is connected to the output terminal of the switch circuit 40, and each of the other three input terminals is connected to a wire CG<8:6>. Each output terminal of the switch circuit 41C is connected in common to an input terminal of a switch circuit 44C of the lower layer WL selection unit 37A of the layer selection circuits 30C0 and 30C2 and an input terminal of a switch circuit 45C of the upper layer WL selection unit 38A.

The switch circuit 41D corresponds to the zones Zn3 (the word lines WL9 to WL11) and Zn19 (the word lines WL57 to WL59) in the chunks CNK0 and CNK2. Among four input terminals of the switch circuit 41D, one input terminal is connected to the output terminal of the switch circuit 40, and each of the other three input terminals is connected to a wire CG<11:9>. Each output terminal of the switch circuit 41D is connected in common to an input terminal of a switch circuit 44D of the lower layer WL selection unit 37A of the layer selection circuits 30C0 and 30C2 and an input terminal of a switch circuit 45D of the upper layer WL selection unit 38A.

1.6.6 Configuration of the Chunk Selection Unit

Next, a configuration of the chunk selection unit 36A is described with reference to FIG. 8.

As illustrated in FIG. 8, the chunk selection unit 36A includes a switch circuit 42 (42A and 42B) and a switch circuit (43A and 43B). Switch circuits 42A and 42B and switch circuits 43A and 43B have the same configuration as the switch circuit 40.

The switch circuits 42A and 42B output any one of the voltages of the wire CGU(D) and the wire CGU(S) to the switch circuits 43A and 43B, respectively.

The switch circuit 43A outputs any one of an output voltage of the switch circuit 42A and the voltage of the wire UCG to the switch circuits 44A and 44B of the lower layer WL selection unit 37A and the switch circuits 45A to 45D of the upper layer WL selection unit 38A.

The switch circuit 43B outputs any one of an output voltage of the switch circuit 42B and the voltage of the wire UCG to the switch circuits 44C and 44D of the lower layer WL selection unit 37A.

Moreover, connections between output terminals of the switch circuit 43A and 43B and input terminals of the switch circuits 44A to 44D and 45A to 45D are not limited to those described herein.

1.6.7 Configuration of the Lower Layer WL Selection Unit

Next, a configuration of the lower layer WL selection unit 37A is described with reference to FIG. 8.

As illustrated in FIG. 8, the lower layer WL selection unit 37A includes a switch circuit 44(44A to 44D). Switch circuits 44A to 44D have the same configuration as the switch circuit 41 (41A to 41D).

One input terminal of the switch circuit 44A is connected to an output terminal of the switch circuit 43A, and the other three input terminals are connected to three output terminals of the switch circuit 41A, respectively. Each output terminal of the switch circuit 44A is connected to each of the wires GWL0 to GWL2. The switch circuit 44A outputs any one of an output voltage of the switch circuit 41A and an output voltage of the switch circuit 43A to the wires GWL0 to GWL2.

In the same manner, the switch circuit 44B outputs any one of an output voltage of the switch circuit 41B and the output voltage of the switch circuit 43A to the wires GWL3 to GWL5. The switch circuit 44C outputs any one of an output voltage of the switch circuit 41C and an output voltage of the switch circuit 43B to the wires GWL6 to GWL8. The switch circuit 44D outputs any one of an output voltage of the switch circuit 41D and the output voltage of the switch circuit 43B to the wires GWL9 to GWL11.

The upper layer WL selection unit 38A includes a switch circuit 45 (45A to 45D). Switch circuits 45A to 45D have the same configuration as the switch circuit 41 (41A to 41D).

One input terminal of the switch circuit 45A is connected to the output terminal of the switch circuit 43A, and the other three input terminals are connected to the three output terminals of the switch circuit 41A, respectively. Each output terminal of the switch circuit 45A is connected to each of the wires GWL48 to GWL50. The switch circuit 45A outputs any one of the output voltage of the switch circuit 41A and the output voltage of the switch circuit 43A to the wires GWL48 to GWL50.

In the same manner, the switch circuit 45B outputs any one of the output voltage of the switch circuit 41B and the output voltage of the switch circuit 43A to the wires GWL51 to GWL53. The switch circuit 45C outputs any one of the output voltage of the switch circuit 41C and the output voltage of the switch circuit 43A to the wires GWL54 to GWL56. The switch circuit 45D outputs any one of the output voltage of the switch circuit 41D and the output voltage of the switch circuit 43A to the wires GWL57 to GWL59.

1.7 Configuration of the Switch Circuit

Next, a configuration of the switch circuit that is included in the WL selection circuit 14A is described.

1.7.1 Configuration of the Switch Circuit 40

First, a configuration of the switch circuit 40 is described with reference to FIG. 9.

Figure 9:
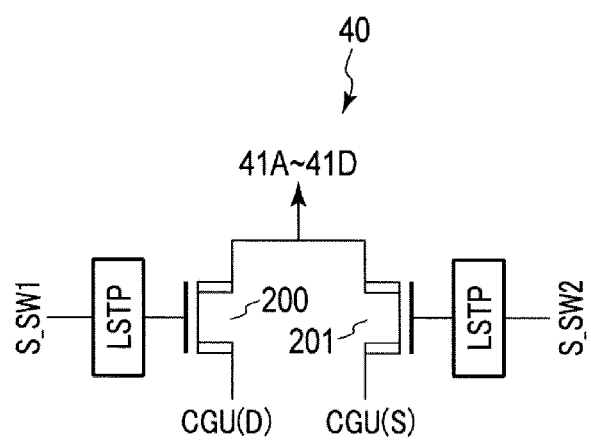
FIGS. 9-13 are circuit diagrams illustrating different switch circuits included in the semiconductor memory device according to the first embodiment.

As illustrated in FIG. 9, the switch circuit 40 includes level shifters LSTP that are respectively connected to gates of high breakdown voltage n channel MOS transistors 200 and 201, and gates of transistors 200 and 201.

One end of the transistor 200 is connected to the wire CGU(D), and the other end is connected to input terminals of the switch circuits 41A to 41D. A gate of the transistor 200 is connected to an output terminal of the level shifter LSTP into which the control signal S_SW1 is input. The control signal S_SW (S_SW1, S_SW2, and so forth) is received from the first row control circuit 25A1. The level shifter LSTP applies a voltage (an input voltage) for driving a transistor, to a gate of the corresponding transistor, according to the control signal S_SW that is to be input. More specifically, for example, if a control signal S_SW1 is at a "H" level, the level shifter LSTP that is connected to the transistor 200 applies a voltage that is higher than a voltage value which is generated by adding a threshold voltage of the transistor 200 to the voltage of the wire CGU(D), to the gate of the transistor 200. Accordingly, the transistor 200 enters into the ON state, and outputs the voltage of the wire CGU(D) to the switch circuits 41A to 41D.

One end of the transistor 201 is connected to the wire CGU(S), and the other end is connected to the other end of the transistor 200 and the switch circuits 41A to 41D. A gate of the transistor 201 is connected to the output terminal of the level shifter LSTP into which a control signal S_SW2 is input.

If the control signal S_SW1 is at the "H" level, the switch circuit 40 causes the transistor 200 to be in the ON state, and electrically connects the wire CGU(D) and the switch circuits 41A to 41D to one another. On the other hand, if the control signal S_SW2 is at the "H" level, the switch circuit 40 causes the transistor 201 to be in the ON state, and electrically connects the wire CGU(S) and the switch circuits 41A to 41D to one another.

1.7.2 Configuration of the Switch Circuit 41A

Next, a configuration of the switch circuit 41A is described with reference to FIG. 10. Moreover, although in an example in FIG. 10, a circuit diagram of the switch circuit 41A is illustrated, the switch circuits 41B to 41D have the same configuration as well.

Figure 10:
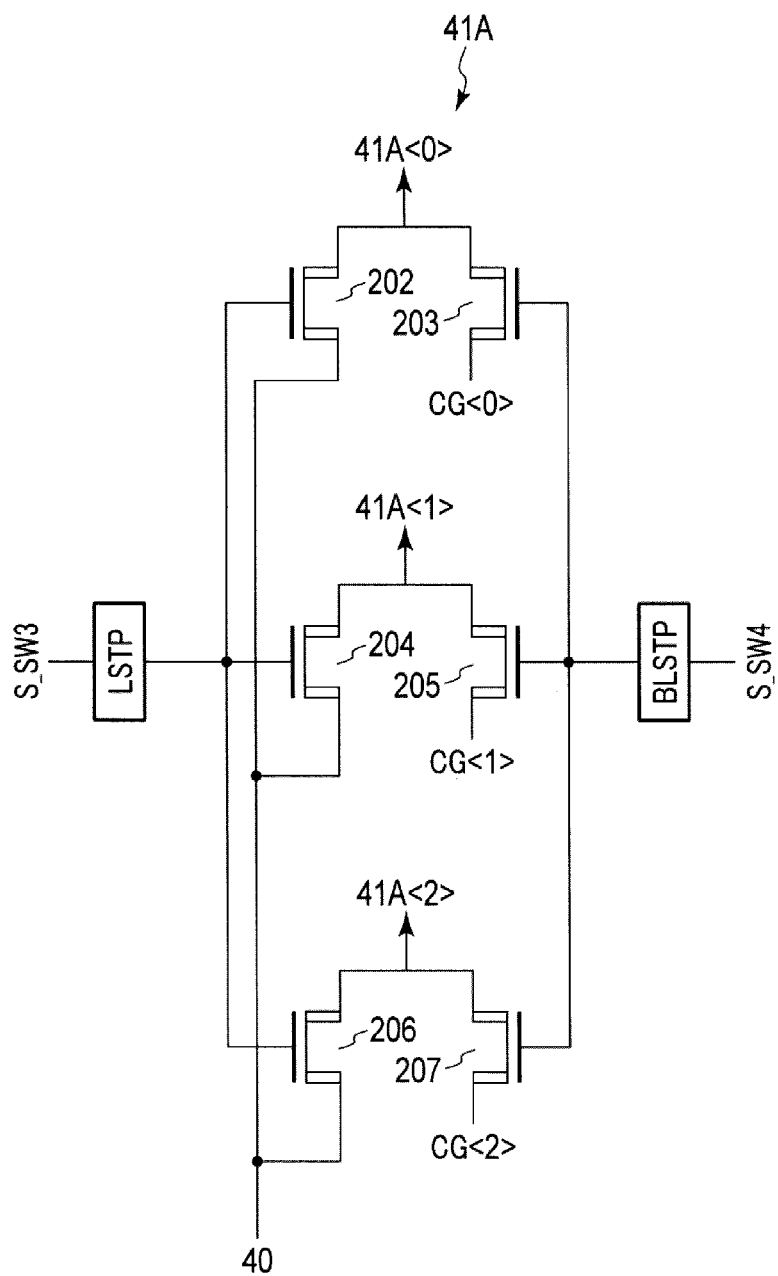

As illustrated in FIG. 10, the switch circuit 41A includes the level shifter LSTP that is connected to gates of high breakdown voltage n channel MOS transistors 202 to 207 and gates of transistors 202, 204, and 206, and a level shifter BLSTP that is connected to gates of transistors 203, 205, and 207.

The level shifter BLSTP is a level shifter that is able to transfer a higher voltage than the level shifter LSTP. According to the present embodiment, the level shifter BLSTP is used for a transistor that is able to transfer a high-voltage program voltage VPGM (for example, approximately 20V). That is, with the WL selection circuit 14A, the level shifter BLSTP is used for the transistor to which the voltage of the wire CG<11:0> is applied. On the other hand, the level shifter LSTP is used for the transistor to which the voltages of the wires CGU(D) and CGU(S) and the wire UCG are applied.

A transistor (transistors 203, 205, and 207 in the example in FIG. 10) that transfers the voltage of the wire CG<11:0> and a high breakdown voltage transistor that is used for the level shifter BLSTP need to transfer a voltage higher than a high breakdown voltage transistor that is used for the other transistors (the transistors 202, 204, and 206 in the example in FIG. 10) and the level shifter LSTP. For this reason, sizes of the transistor that transfers the voltage of the wire CG<11:0> and the transistor that is used for the level shifter BLSTP are larger than sizes of the transistor that transfers the voltages of the wires CGU(D) and CGU(S) and the wire UCG and the transistor that is used for the level shifter LSTP. For this reason, a circuit area of the level shifter BLSTP is larger than a circuit area of the level shifter LSTP.

One end of the transistor 202 is connected to the transistors 204 and 206 and an output terminal of the switch circuit 40. The other end of the transistor 202 is connected to an output terminal (or an output wire) 41A<0> of the switch circuit 41A. A gate of the transistor 202 is connected to gates of the transistors 204 and 206, and the output terminal of the level shifter LSTP into which a control signal S_SW3 is input.

The other end of the transistor 204 is connected to an output terminal 41A<1> of the switch circuit 41A.

The other end of the transistor 206 is connected to an output terminal 41A<2> of the switch circuit 41A.

One end of the transistor 203 is connected to a wire CG<0>, and the other end is connected to the other end of the transistor 202 and an output terminal 41A<0> of the switch circuit 41A. A gate of the transistor 203 is connected to gates of the transistors 205 and 207 and an output terminal of the level shifter BLSTP into which a control signal S_SW4 is input.

One end of the transistor 205 is connected to a wire CG<1>, and the other end is connected to the other end of the transistor 204 and the output terminal 41A<1> of the switch circuit 41A.

One end of the transistor 207 is connected to a wire CG<2>, and the other end is connected to the other end of the transistor 206 and the output terminal 41A<2> of the switch circuit 41A.

If the control signal S_SW3 is at the "H" level, the switch circuit 41A causes the transistors 202, 204, and 206 to be in the ON state, and outputs the output voltage (any one of the voltage of the wire CGU(D) and the voltage of the wire CGU(S)) of the switch circuit 40 from an output terminal 41A<2:0>. On the other hand, if the control signal S_SW4 is at the "H" level, the switch circuit 41A causes the transistors 203, 205, and 207 to be in the On state, and outputs the voltage of the wire CG<2:0> from the output terminal 41A<2:0>.

1.7.3 Configuration of the Switch Circuit 42A

A configuration of the switch circuit 42A is described with reference to FIG. 11. Moreover, although in an example in FIG. 11, a circuit diagram of the switch circuit 42A is illustrated, the switch circuit 42B has the same configuration as well.

Figure 11:
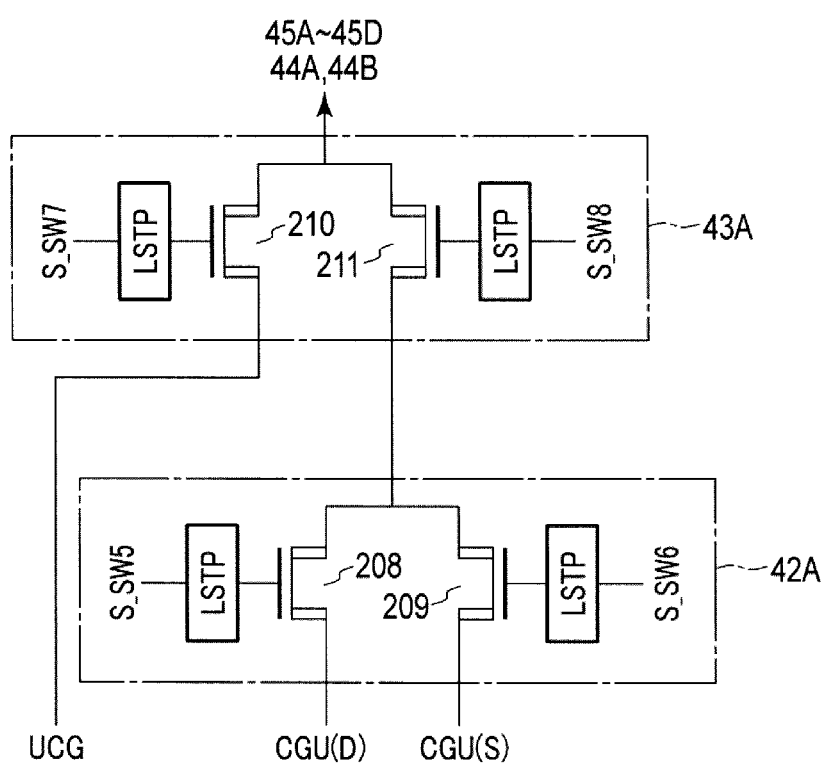

As illustrated in FIG. 11, the switch circuit 42A includes the level shifters LSTP that are respectively connected to gates of high breakdown voltage n channel MOS transistors 208 and 209, and gates of transistors 208 and 209. The configuration of the switch circuit 42A is the same as that of the switch circuit 40 in FIG. 9. The transistors 208 and 209 of the switch circuit 42A are equivalent to the transistors 200 and 201 of the switch circuit 40.

One end of the transistor 208 is connected to the wire CGU(D), and the other end is connected to one input terminal (or one input wire) of the switch circuit 43A. A gate of the transistor 208 is connected to the output terminal of the level shifter LSTP into which a control signal S_SW5 is input.

One end of the transistor 209 is connected to the wire CGU(S), and the other end is connected to the other end of the transistor 208 and one input terminal of the switch circuit 43A. A gate of the transistor 209 is connected to the output terminal of the level shifter LSTP into which a control signal S_SW6 is input.

If the control signal S_SW5 is at the "H" level, the switch circuit 42A causes the transistor 208 to be in the ON state, and electrically connects the wire CGU(D) and the switch circuit 43A to each other. On the other hand, if the control signal S_SW2 is at the "H" level, the switch circuit 42A causes the transistor 209 to be in the ON state, and electrically connects the wire CGU(S) and the switch circuits 43A.

1.7.4 Configuration of the Switch Circuit 43A

Next, a configuration of the switch circuit 43A is described with reference to FIG. 11. Moreover, although in the example in FIG. 11, a circuit diagram of the switch circuit 43A is illustrated, the switch circuit 43B has the same configuration as well.

As illustrated in FIG. 11, the switch circuit 43A includes the level shifter LSTP that is connected to gates of high breakdown voltage n channel MOS transistors 210 and 211, and gates of transistors 210 and 211. The configuration of the switch circuit 43A is the same as that of the switch circuit 40 in FIG. 9. The transistors 210 and 211 of the switch circuit 43A are equivalent to the transistors 200 and 201 of the switch circuit 40.

One end of the transistor 210 is connected to the wire UCG, and the other end is connected to the input terminals of the switch circuits 44A, 44B and 45A to 45D. A gate of the transistor 210 is connected to the output terminal of the level shifter LSTP into which a control signal S_SW7 is input.

One end of the transistor 211 is connected to an output terminal of the switch circuit 42A, and the other end is connected to the other end of the transistor 210 and the input terminals of the switch circuits 44A, 44B, and 45A to 45D. A gate of the transistor 211 is connected to the output terminal of the level shifter LSTP into which a control signal S_SW8 is input.

If the control signal S_SW7 is at the "H" level, the switch circuit 43A causes the transistor 210 to be in the ON state, and electrically connects the wire UCG and the switch circuits 44A, 44B, and 45A to 45D to one another. On the other hand, if the control signal S_SW8 is at the "H" level, the switch circuit 43A causes the transistor 211 to be in the ON state, and electrically connects the switch circuit 42A and the switch circuits 44A, 44B, and 45A to 45D to one another.

1.7.5 Configuration of the Switch Circuit 44A

Next, a configuration of the switch circuit 44A is described with reference to FIG. 12. Moreover, although in an example in FIG. 12, a circuit diagram of the switch circuit 44A is illustrated, the switch circuits 44B to 44D have the same configuration as well.

Figure 12:
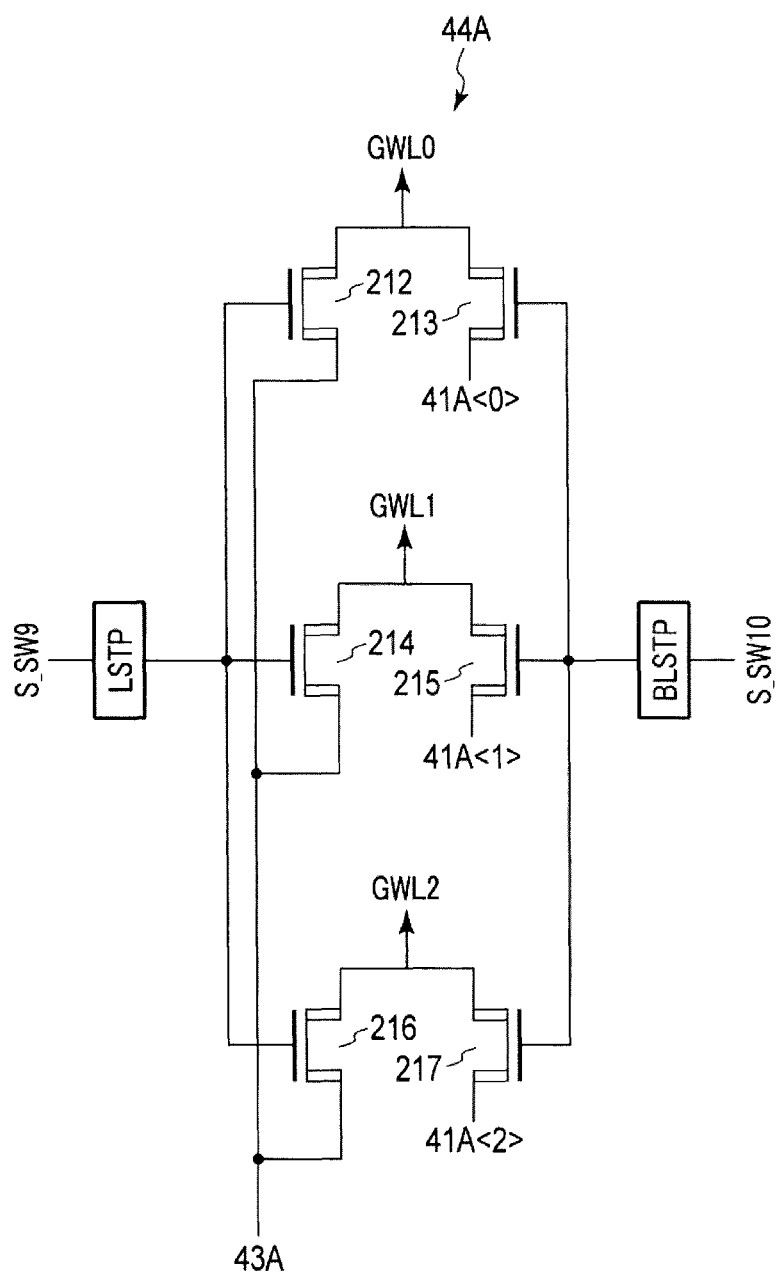

As illustrated in FIG. 12, the switch circuit 44A includes the level shifter LSTP that is connected to gates of high breakdown voltage n channel MOS transistors 212 to 217, and gates of transistors 212, 214, and 216, and the level shifter BLSTP that is connected to gates of transistors 213, 215, and 217. The configuration of the switch circuit 44A is the same as that of the switch circuit 41A in FIG. 10. The transistors 212 to 217 of the switch circuit 44A are equivalent to the transistors 202 to 207 of the switch circuit 41A.

One end of the transistor 212 is connected to the transistors 214 and 216, and the output terminal of the switch circuit 43A. The other end of the transistor 212 is connected to the wire GWL0. A gate of the transistor 212 is connected to gates of the transistors 214 and 216, and the output terminal of the level shifter LSTP into which a control signal S_SW9 is input.

The other end of the transistor 214 is connected to the wire GWL1.

The other end of the transistor 216 is connected to the wire GWL2.

One end of the transistor 213 is connected to the output terminal 41A<0> of the switch circuit 41A, and the other end is connected to the other end of the transistor 212 and the wire GWL0. A gate of the transistor 213 is connected to gates of the transistors 215 and 217 and the output terminal of the level shifter BLSTP into which a control signal S_SW10 is input.

One end of the transistor 215 is connected to the output terminal 41A<1> of the switch circuit 41A, and the other end is connected to the other end of the transistor 214 and the wire GWL1.

One end of the transistor 217 is connected to the output terminal 41A<2> of the switch circuit 41A, and the other end is connected to the other end of the transistor 216 and the wire GWL2.

If the control signal S_SW9 is at the "H" level, the switch circuit 44A causes the transistors 212, 214, and 216 to be in the ON state, and outputs the output voltage (any one of the voltage of the wire CGU(D), the voltage of the wire CGU(S), and the voltage of the wire UCG) of the switch circuit 43A to the wires GWL0 to GWL2. On the other hand, if the control signal S_SW10 is at the "H" level, the switch circuit 44A causes the transistors 213, 215, and 217 to be in the ON state, and outputs the output voltage (any one of the voltage of the wire CG<2:0>, the voltage of the wire CGU(D), and the voltage of the wire CGU(S)) of the switch circuit 41A to the wires GWL0 to GWL2.

1.7.6 Configuration of the Switch Circuit 45A

Next, a configuration of the switch circuit 45A is described with reference to FIG. 13. Moreover, although in an example in FIG. 13, a circuit diagram of the switch circuit 45A is illustrated, the switch circuits 45B to 45D have the same configuration as well.

Figure 13:
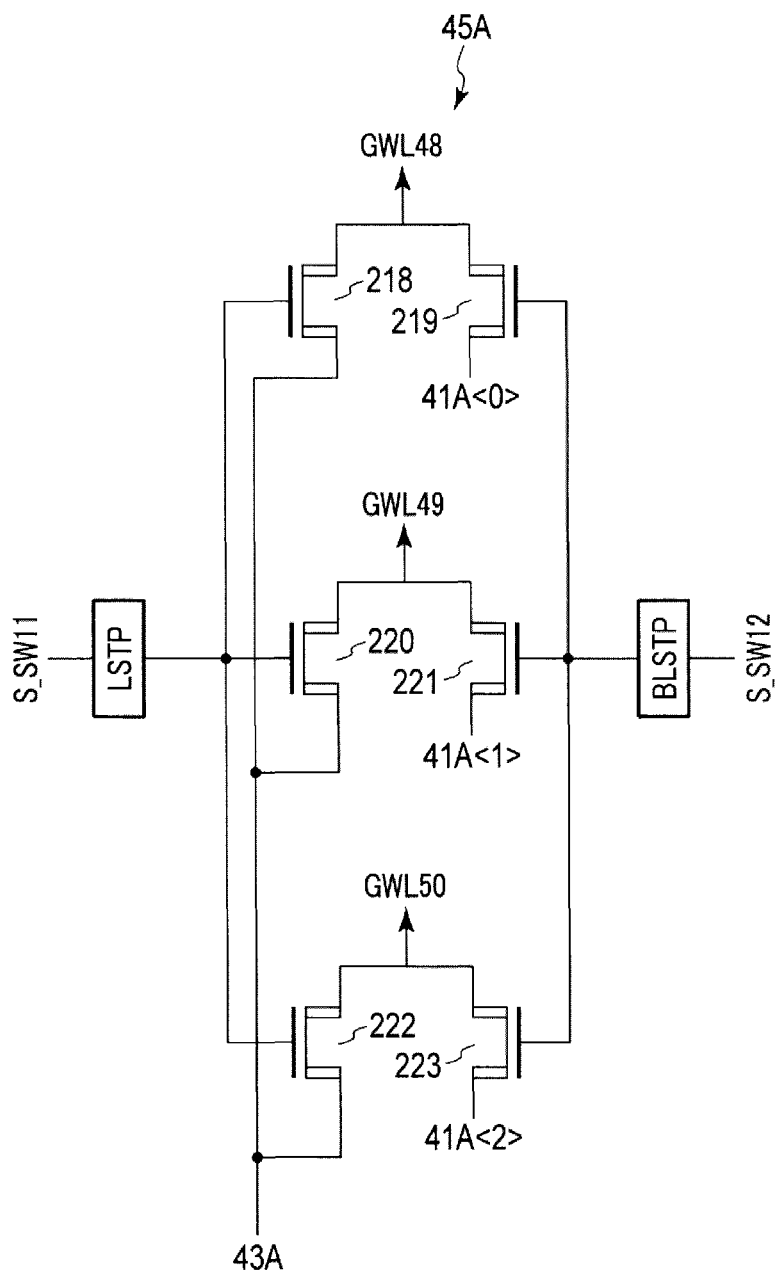

As illustrated in FIG. 13, the switch circuit 45A includes the level shifter LSTP that is connected to gates of high breakdown voltage n channel MOS transistors 218 to 223, and gates of transistors 218, 220, and 222, and the level shifter BLSTP that is connected to gates of transistors 219, 221, and 223. The configuration of the switch circuit 45A is the same as that of the switch circuit 41A in FIG. 10. The transistors 218 to 223 of the switch circuit 45A are equivalent to the transistors 202 to 207 of the switch circuit 41A.

One end of the transistor 218 is connected to the transistors 220 and 222, and the output terminal of the switch circuit 43A. The other end of the transistor 218 is connected to the wire GWL48. A gate of the transistor 218 is connected to gates of the transistors 220 and 222, and the output terminal of the level shifter LSTP into which a control signal S_SW11 is input.

The other end of the transistor 220 is connected to the wire GWL49.

The other end of the transistor 222 is connected to the wire GWL50.

One end of the transistor 219 is connected to the output terminal 41A<0> of the switch circuit 41A, and the other end is connected to the other end of the transistor 218 and the wire GWL48. A gate of the transistor 219 is connected to gates of the transistors 221 and 223 and the output terminal of the level shifter BLSTP into which a control signal S_SW12 is input.

One end of the transistor 221 is connected to the output terminal 41A<1> of the switch circuit 41A, and the other end is connected to the other end of the transistor 220 and the wire GWL49.

One end of the transistor 223 is connected to the output terminal 41A<2> of the switch circuit 41A, and the other end is connected to the other end of the transistor 222 and the wire GWL50.

If the control signal S_SW11 is at the "H" level, the switch circuit 45A causes the transistors 218, 220, and 222 to be in the ON state, and outputs the output voltage (any one of the voltage of the wire CGU(D), the voltage of the wire CGU(S), and the voltage of the wire UCG) of the switch circuit 43A to the wires GWL48 to GWL50. On the other hand, if the control signal S_SW12 is at the "H" level, the switch circuit 45A causes the transistors 219, 221, and 223 to be in the ON state, and outputs the output voltage (the voltage of the wire CG<2:0>, the voltage of the wire CGU(D), the voltage of the wire CGU(S)) of the switch circuit 41A to the wires GWL48 to GWL50.

1.8 Configuration of the SG Selection Circuit

Next, a configuration of the SG selection circuit 15A is described with reference to FIG. 14. Although FIG. 14 illustrates the SG selection circuit 15A, the SG selection circuit 15B has the same configuration as well.

Figure 14:
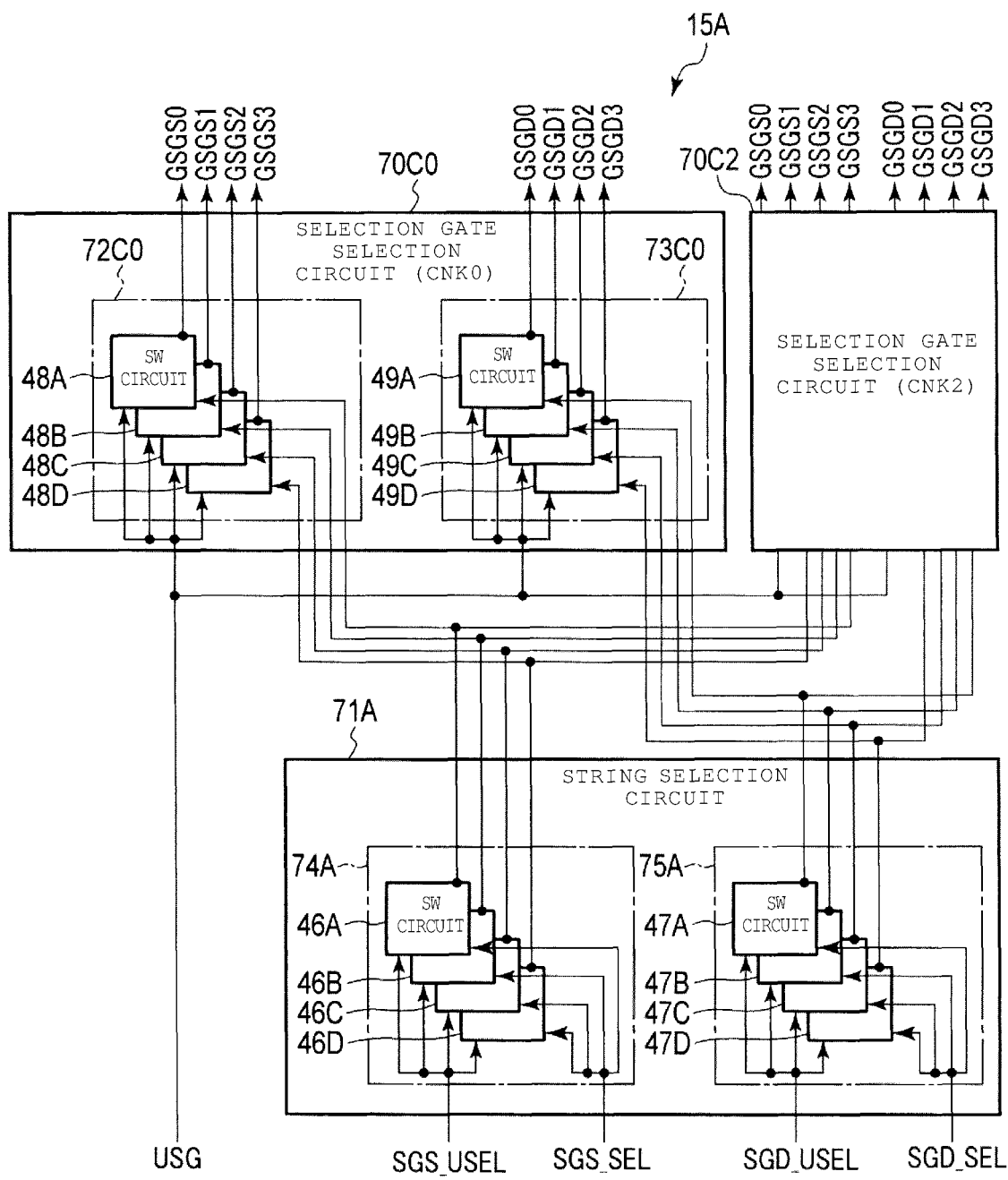
FIG. 14 is a block diagram illustrating an SG selection circuit that is included in the semiconductor memory device according to the first embodiment.

As illustrated in FIG. 14, the SG selection circuit 15A generally includes a selection gate selection circuit 70C0 that corresponds to the chunk CNK0, a selection gate selection circuit 70C2 that corresponds to the chunk CNK2, and a string selection circuit 71A that corresponds to the chunks CNK0 and CNK2. Moreover, although in an example in FIG. 14, the configuration of the selection gate selection circuit 70C2 is omitted for brevity, the configuration of the selection gate selection circuit 70C2 is the same as that of the selection gate selection circuit 70C0.

Based on the control signal S_SW that is transmitted from the first row control circuit 25A1, the string selection circuit 71A outputs the voltages of the wires SGS_SEL, SGS_USEL, SGD_SEL, and SGD_USEL to the selection gate selection circuits 70C0 and 70C2. The string selection circuit 71A includes an SGS selection unit 74A that corresponds to the selection gate line SGS, and an SGD selection unit 75A that corresponds to the selection gate line SGD.

The SGS selection unit 74A outputs any one of the voltage of the wire SGS_SEL and the voltage of the wire SGS_USEL to the selection gate selection circuits 70C0 and 70C2. The SGS selection unit 74A includes a switch circuit 46 (46A TO 46D).

Switch circuits 46A to 46D correspond to the wires GSGS0 to GSGS3, respectively, in the chunk CNK0 and CNK2. The switch circuits 46A to 46D have the same configuration as the switch circuit 40 in FIG. 9. Each of the switch circuits 46A to 46D includes two input terminals and one output terminal. One input terminal of each of the switch circuits 46A to 46D is connected in common to the wire SGS_SEL, and the other input terminal is connected in common to the wire SGS_USEL. Furthermore, output terminals of the switch circuits 46A to 46D are connected to input terminals, respectively, of switch circuits 48A to 48D of the selection gate selection circuits 70C0 and 70C2.

For example, if the string unit SU0 in any block BLK that is included in the chunk CNK0 or CNK2 is selected, the switch circuit 46A outputs the voltage of the wire SGS_SEL to the switch circuit 48A of a GSGS selection unit 72C0. On the other hand, the switch circuits 46B to 46D output the voltage of the wire SGS_USEL to switch circuits 48B to 48D. The same is true also for a case where the string units SU1 to SU3 are selected.

The SGD selection unit 75A outputs any one of the voltage of the wire SGD_SEL and the voltage of the wire SGD_USEL to the selection gate selection circuits 70C0 and 70C2. The SGD selection unit 75A includes a switch circuit 47 (47A to 47D).

Switch circuits 47A to 47D correspond to the wires GSGD0 to GSGD3, respectively, in the chunks CNK0 and CNK2. The switch circuits 46A to 46D have the same configuration as the switch circuit 40 in FIG. 9. Each of the switch circuits 46A to 46D includes two input terminals and one output terminal. One input terminal of each of the switch circuits 47A to 47D is connected in common to the wire SGD_SEL, and the other input terminal is connected in common to the wire SGD_USEL. Furthermore, output terminals of the switch circuits 47A to 47D are connected to input terminals, respectively, of switch circuits 49A to 49D of the selection gate selection circuits 70C0 and 70C2.

For example, if the string unit SU0 in any block BLK that is included in the chunk CNK0 or CNK2 is selected, the switch circuit 47A outputs the voltage of the wire SGD_SEL to the switch circuit 49A of a GSGD selection unit 73C0. On the other hand, the switch circuits 47B to 47D outputs the voltage of the wire SGS_USEL to switch circuits 49B to 49D. The same is true also for a case where the string units SU1 to SU3 are selected.

Based on the control signal S_SW that is transmitted from the first row control circuit 25A1, the selection gate selection circuit 70C0 (and 70C2) outputs voltage of the wire USG or an output voltage of the string selection circuit 71A to the wires GSGS0 to GSGS3 and GSGD0 to GSGD3. The selection gate selection circuit 70C0 (and 70C2) includes the GSGS selection unit 72C0 that corresponds to the wires GSGS0 to GSGS3, and the GSGD selection unit 73C0 that corresponds to the wires GSGD0 to GSGD3.

The GSGS selection unit 72C0 outputs any one of the voltage of the wire USG and an output voltage of the SGS selection unit 74A to the wires GSGS0 to GSGS3. The GSGS selection unit 72C0 includes a switch circuit 48 (48A to 48D).

Switch circuits 48A to 48D correspond to the wires GSGS0 to GSGS3, respectively, in the chunk CNK0. The switch circuits 48A to 48D have the same configuration as the switch circuit 40 in FIG. 9. Each of the switch circuits 48A to 48D includes two input terminals and one output terminal. One input terminal of each of the switch circuits 48A to 48D is connected in common to the wire USG, and the other input terminal is connected to each of the output terminals of the switch circuits 46A to 46D. Furthermore, the output terminal of each of the switch circuits 48A to 48D is connected to each of the wires GSGS0 to GSGS3.

For example, if the chunk CNK0 is selected, the switch circuits 48A to 48D output output voltages of the switch circuits 46A to 46D to the wires GSGS0 to GSGS3, respectively. On the other hand, if the chunk CNK0 is non-selected, the switch circuits 48A to 48D output the voltage of the wire USG to the wires GSGS0 to GSGS3, respectively.

The GSGD selection unit 73C0 outputs any one of the voltage of the wire USG and an output voltage of the SGD selection unit 75A to the wires GSGD0 to GSGD3. The GSGD selection unit 73C0 includes a switch circuit 49 (49A to 49D).

The switch circuits 49A to 49D correspond to the wires GSGD0 to GSGD3, respectively, in the chunk CNK0. The switch circuits 49A to 49D have the same configuration as the switch circuit 40 in FIG. 9. Each of the switch circuits 49A to 49D includes two input terminals and one output terminal. One input terminal of each of the switch circuits 49A to 49D is connected in common to the wire USG, and the other input terminal is connected to each of the output terminals of the switch circuits 47A to 47D. Furthermore, the output terminal of each of the switch circuits 49A to 49D is connected to each of the wires GSGD0 to GSGD3.

For example, if the chunk CNK0 is selected, the switch circuits 49A to 49D output output voltages of the switch circuits 47A to 47D to the wires GSGD0 to GSGD3, respectively. On the other hand, if the chunk CNK0 is non-selected, the switch circuits 49A to 49D output the voltage of the wire USG to the wires GSGD0 to GSGD3, respectively.

1.9 Specific Example of a Word Line Connection Operation in the Writing Operation Next, a specific example of a WL connection operation in the writing operation is described. The same WL connection operation is also performed in the reading operation.

1.9.1 Specific Example of the Zone Selection

First, a specific example of the zone selection is described with reference to FIG. 15. Moreover, in the example of FIG. 15, the zone Zn that corresponds to the word lines WL0 to WL23 is illustrated for brevity.

Figure 15:
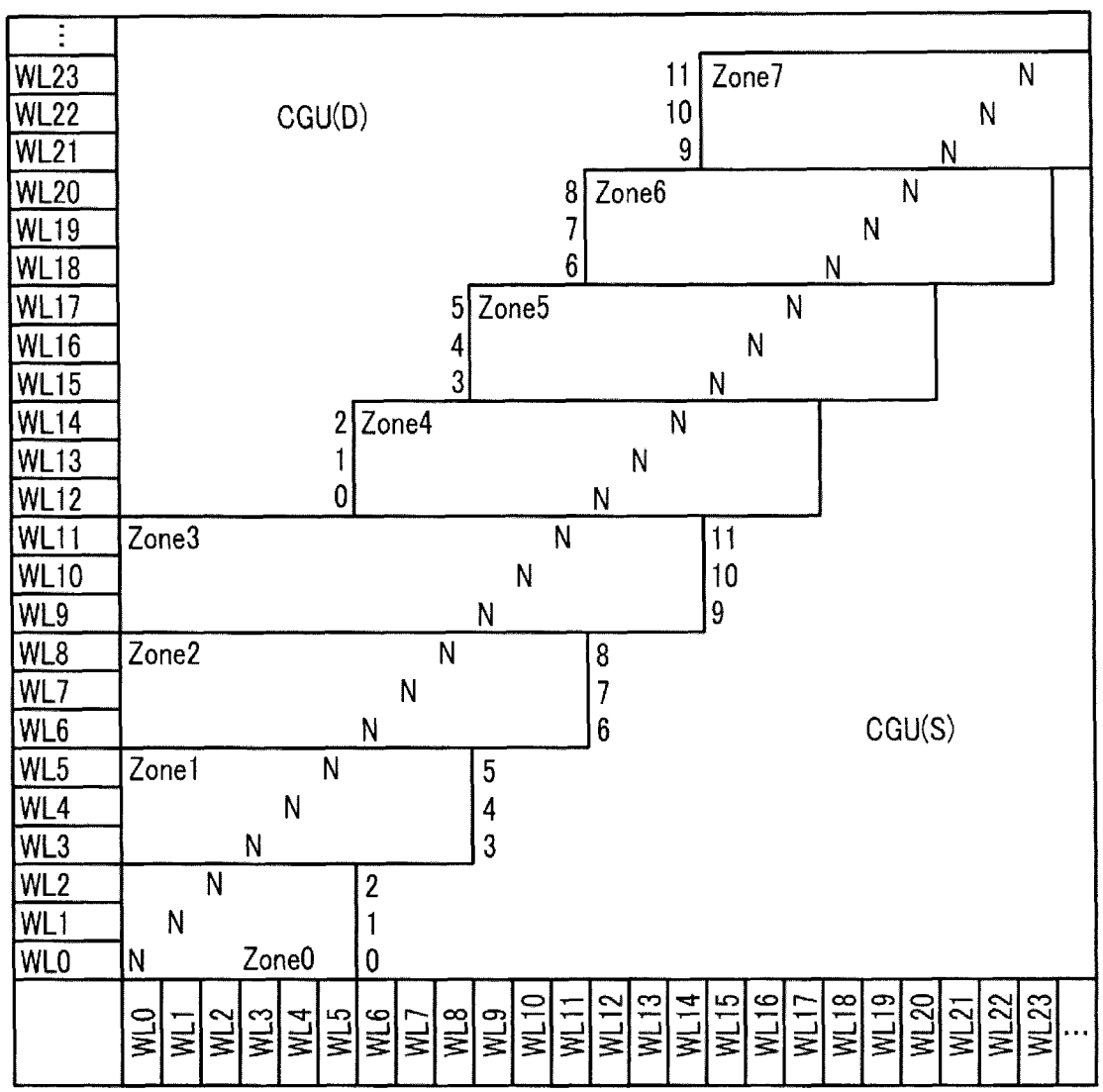
FIG. 15 is a diagram illustrating a relationship between a selected word line and zone allocation in the semiconductor memory device according to the first embodiment.

A word line WL number along the horizontal axis in FIG. 15 indicates the selected word line WL, and a word line WL number along the vertical axis indicates allocation of zone selection that corresponds to the word line WL. Because the selection zone Zn is suitably switched according to the selected word line WL, the width of the zone Zn that is indicated along the horizontal axis corresponds to the selected word line WL by which the zone Zn is selected. Then, numbers from 0 to 11, which are written along the vertical side of a rectangular frame that indicates the zone Zn, indicate the wire CG<11:0> that is connected. Furthermore, a reference character N indicates a place where the number of the word line WL along the horizontal axis and the number of the word line WL along vertical axis are the same.

As illustrated in FIG. 15, each zone Zn is provided corresponding to the word line WL. For example, the word lines WL0 to WL2 are included in the zone Zn0. If any one of the word lines WL0 to WL5 is selected, the zone Zn0 is selected. Then, if the zone Zn0 is selected, the word line WL0 to WL2 are connected to the wires CG<0> to CG<2>, respectively.

For example, in the writing operation, if the word line WL10 in the block BLK0 that is included in the chunk CNK0 within the plane PLN0 is selected, the corresponding first row control circuit 25A1 selects the zones Zn2 to Zn5 based on a table in FIG. 15. Then, in the first row selection circuit 12A, the word lines WL6 to WL17 in the block BLK0 are connected to the wires CG<6> to CG<11> and CG<0> to CG<5>, respectively, through the row decoder 13C0 and the WL selection circuit 14A. In the same manner, the word line WL0 to WL5 in block BLK0 are connected to the wire CGU(S), and the word lines WL18 to WL95 are connected to the wire CGU(D). At this time, the program voltage VPGM is applied to a wire CG<10> that corresponds to a selected word line WL10.

1.9.2 Specific Example of Operation of the WL Selection Circuit

Next, to describe operation of the WL selection circuit 14A in detail, a case where the word line WL10 in the block BLK0 that is included in the chunk CNK0 within the plane PLN0 is selected is given as an example.

Because the word line WL10 is included in the lower layer WL group, the first row control circuit 25A1 controls the zone selection circuit 34A based on information of the zones Zn0 to Zn15 that correspond to the lower layer WL group. In the zone selection circuit 34A, the switch circuit 41 that corresponds to the selected zones Zn2 to Zn5 outputs the voltage of the wire CG<11:0> to the lower layer WL selection unit 37 and the upper layer WL selection unit 38 in each block BLK. More specifically, the switch circuit 41C of the zone selection unit 39A that corresponds to the zone Zn2 outputs a voltage of the wire CG<8:6>. The switch circuit 41D of the zone selection unit 39A that correspond to zone Zn3 outputs a voltage of the wire CG<11:9>. The switch circuit 41A of the zone selection unit 39B that corresponds to zone Zn4 outputs the voltage of the wire CG<2:0>. The switch circuit 41B of the zone selection unit 39B that corresponds to zone Zn5 outputs a voltage of the wire CG<5:3>. Furthermore, the switch circuits 41A and 41B of the zone selection unit 39A that correspond to the zones Zn0 and Zn1 output the voltage of the wire CGU(S) that is output from the switch circuit 40, to the lower layer WL selection unit 37 and the upper layer WL selection unit 38 in each block BLK. Other switch circuits 41 that correspond to the zones Zn6 to Zn15 output the voltage of the wire CGU(D) that is output from the switch circuit 40, to the lower layer WL selection unit 37 and the upper layer WL selection unit 38 in each block BLK.

In the chunk selection unit 36, the switch circuit 43 that corresponds to the selected block BLK0 outputs the voltage (the voltage of the wire CGU(D) in the present example) of the wire CGU(D) or the wire CGU(S), to the lower layer WL selection unit 37 and the upper layer WL selection unit 38. The switch circuit 43 that corresponds to a non-selected block BLK outputs the voltage of the wire UCG to the lower layer WL selection unit 37 and the upper layer WL selection unit 38.

In the lower layer WL selection unit 37, the switch circuit 44 outputs an output voltage of the switch circuit 41. That is, the voltage of the wire CGU(S) is applied to the wires GWL0 to GWL5, and voltages of the wires CG<6> to CG<11> and CG<0> to CG<5> are applied to the wires GWL6 to GWL17, respectively. Furthermore, the voltage of the wire CGU(D) is applied to the wires GWL18 to GWL47.

In the upper layer WL selection unit 38, the switch circuit 45 outputs an output voltage of the switch circuit 43. That is, the voltage of the wire CGU(D) is applied to the wires GWL48 to GWL95.

1.9.3 Specific Example of Operation of the Row Decoder

Next, to describe operation of the row decoder 13C0 in detail, a case where the word line WL10 in the block BLK0 that is included in the chunk CNK0 within the plane PLN0 is selected is given as an example.

In the row decoder 13C0, as a result of decoding the address information ADD, the block decoder 60B0 causes the corresponding transistor 400 to be in the ON state. Accordingly, the wires GWL0 to GWL95 are electrically connected to the word line WL0 to WL95 in the block BLK0, respectively.

1.10 Effect According to the Present Embodiment

The semiconductor memory device according to the present embodiment can suppress an increase in a chip area. The present effect will be specifically described.

As miniaturization and multi-leveling advance in a NAND flash memory, the number of different types of voltages that are required increase. For example, a focus on the writing operation leads to application of many types of voltages to the non-selected word line WL. Particularly, in order to suppress erroneous writing and improve reliability of the writing operation, it is necessary to apply a suitable voltage to each of the neighboring word lines (for example, something like WL (i−4) to WL (i+4)) that include a selected word line WLi. The same is true also for the case of the reading operation. For this reason, a CG driver supplies a voltage necessary for each of these word lines WL through a plurality of wires CG.

The word line WL that is connected to the CG driver (that is, the wire CG) needs to be switched according to the selected word line WL. For this purpose, there is a method in which the word line WL is divided into a plurality of zones Zn and the word line WL that is connected to the CG driver is selected by making a selection from among the plurality of zones Zn. In this case, a zone selection circuit is needed in accordance with each zone Zn in a zone selection circuit. As the total number of word lines WL increases with large-scale integration, the total number of zones Zn increase. That is, the number of necessary switch circuits increases as well. For example, it is assumed that a set of three word lines WL is one zone Zn. Then, if the total number of word lines WL is 12, the total number of zones Zn is 4, and if the total number of word lines WL is 96, the total number of zones Zn is 32. Therefore, 32 switch circuits are necessary. For this reason, there is a tendency for a circuit area of the zone selection circuit to increase with large-scale integration.

In contrast, in a configuration according to the present embodiment, a WL selection circuit includes a chunk/zone selection circuit, a lower layer WL selection circuit, and an upper layer WL selection circuit. Accordingly, one zone selection unit 39 corresponds to both of a lower layer WL group and an upper layer WL group. That is, with one switch circuit 41, one zone Zn that is included in the lower layer WL group can be selected, and one zone Zn that is included in the upper layer WL group can be selected. Because one switch circuit 41 can correspond to the two zones, an increase in the number of switch circuits 41 that accompanies an increase in the number of zones Zn, that is, an increase in the circuit area of the zone selection circuit can be suppressed. Consequently, the increase in the chip area that accompanies large-scale integration can be suppressed.

Moreover, according to the present embodiment, the word lines WL are divided into two groups, that is, the upper layer WL group and the lower layer WL group, but may be divided into three or more groups. In this case, because one switch circuit 41 can correspond to three or more zones, the increase in the chip area can be suppressed even more.

Additionally, because an increase in the number of switch circuits 41 can be suppressed, the inclusion in the switch circuit 41 is possible. An increase in the number of switch elements (transistors) and an increase in the number of level shifters LSTP and BLSTP can be suppressed. In addition, an increase in the number of level shifters BLSTP, each of which includes a comparatively large circuit area that corresponds to a high breakdown voltage, can be suppressed, and thus the increase in the chip area can be suppressed.

Additionally, in the configuration according to the present embodiment, because the increase in the number of switch circuits 41 can be suppressed, the number of switch circuits 40 that are connected to the switch circuits 41 can be decreased. Consequently, the increase in the chip area can be suppressed.

Additionally, in the configuration according to the present embodiment, one chunk selection unit 36 can correspond to both of the lower layer WL group and the upper layer WL group. Consequently, in the same manner as in the zone selection unit 39, an increase in the number of chunk selection units 36 can be suppressed. Consequently, the increase in the chip area can be suppressed.

2. Second Embodiment

Next, a second embodiment is described. The second embodiment relates to the row driver control circuit 23 and the row driver 24 that are described according to the first embodiment. Moreover, according to the present embodiment, the WL selection circuits 14A and 14B may have a configuration different from the configuration according to the first embodiment. For example, one switch circuit 41 may be provided corresponding to one zone Zn. Only points that are different in the present embodiment from the first embodiment will be described below.

2.1 Configuration of the Row Driver Control Circuit

First, a configuration of the row driver control circuit 23 is described with reference to FIG. 16.

Figure 16:
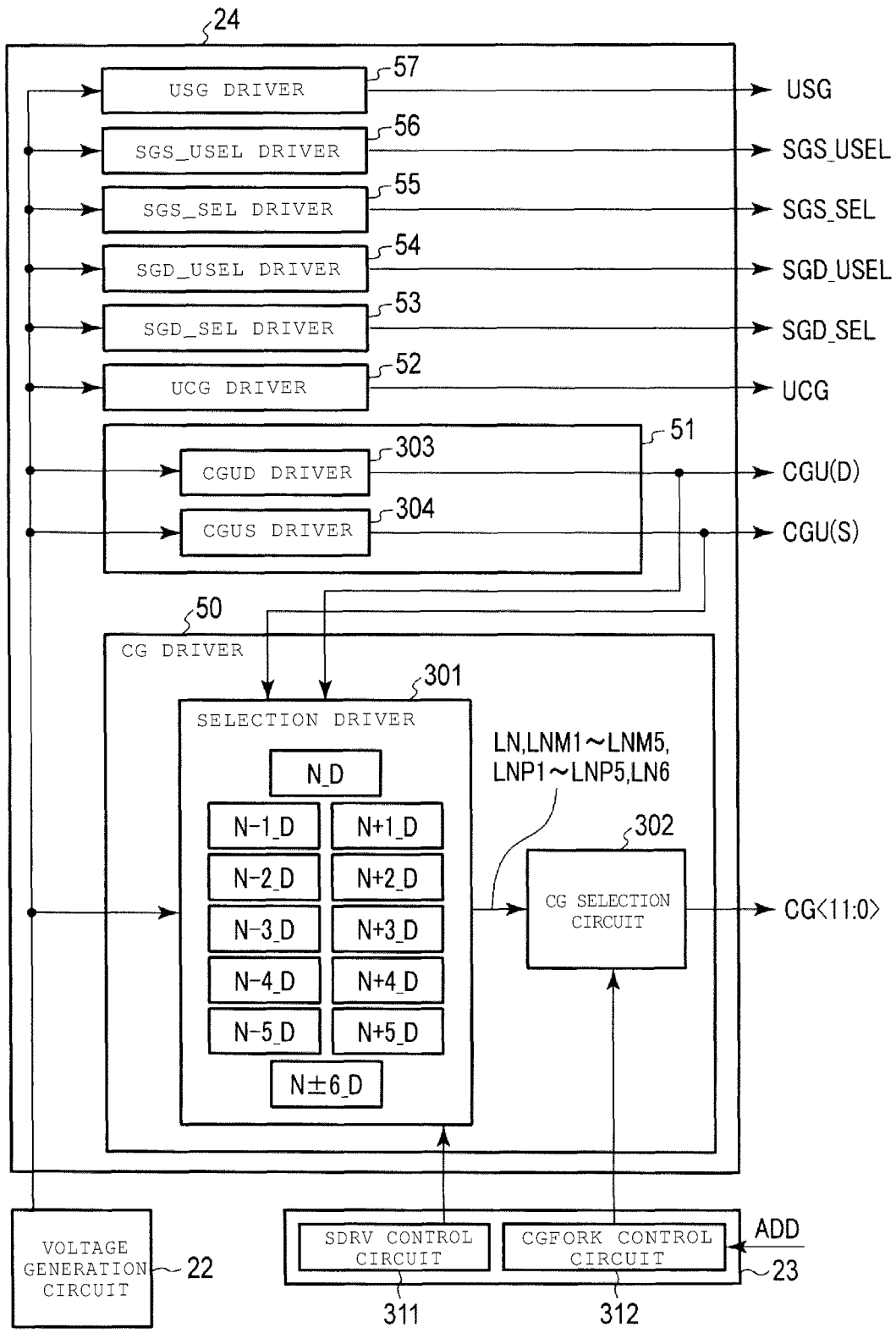
FIG. 16 is a block diagram illustrating a row driver control circuit and a row driver that are included in a semiconductor memory device according to a second embodiment.

As illustrated in FIG. 16, the row driver control circuit 23 includes an SDRV control circuit 311 and a CGFORK control circuit 312.

The SDRV control circuit 311 controls an output voltage and an output timing of a selection driver 301 within the row driver 24, which will be described below.

The CGFORK control circuit 312 controls a CG selection circuit 302 within the row driver 24, which will be described below. More specifically, for example, based on the CGFORK control circuit 312 and the address information ADD, connections to wires LN, LNM1 to LNM5, LNP1 to LNP5, and LN6, and a wire <11:0> are controlled.

2.2 Configuration of the Row Driver

Next, a configuration of the row driver 24 is described with reference to FIG. 16. Moreover, the UCG driver 52, the SGD_SEL driver 53, the SGD_USEL driver 54, the SGS_SEL driver 55, the SGS_USEL driver 56, and the USG driver 57 are as described with reference to FIG. 1 according to the first embodiment, and thus descriptions thereof are omitted in the present embodiment.

As illustrated in FIG. 16, the CG driver 50 includes the selection driver 301 and the CG selection circuit 302.

The selection driver 301 outputs an output voltage of the voltage generation circuit 22 or the CGU driver 51 to a CG selection circuit through the wires LN, LNM1 to LNM5, LNP1 to LNP5, and LN6. The wires LN, LNM1 to LNM5, LNP1 to LNP5, and LN6, are hereinafter generally referred to as a wire L. The selection driver 301 includes 12 dedicated drivers [N_D], [N−1_D], [N−2_D], [N−3_D], [N−4_D], [N−5_D], [N+1_D], [N+2_D], [N+3_D], [N+4_D], [N+5_D], and [N±6_D], which correspond to 12 wires CG<11:0>. The dedicated drivers [N_D], [N−1_D], [N−2_D], [N−3_D], [N−4_D], [N−5_D], [N+1_D], [N+2_D], [N+3_D], [N+4_D], [N+5_D], and [N±6_D] are hereinafter generally referred to as a dedicated driver [D].

The dedicated driver [N_D] outputs a voltage which is to be applied to the selected word line WLi, to the CG selection circuit 302 through the wire LN. For example, the dedicated driver [N_D] outputs the program voltage VPGM or a reading voltage VCGRV that is supplied from the voltage generation circuit 22.

The dedicated driver [N−1_D] outputs a voltage which is to be applied to a non-selected word line WL (i−1), to the CG selection circuit 302 through the wire LNM1. Moreover, because the dedicated driver [N−1_D] does not output the program voltage VPGM that is to be applied to the selected word line WLi, the dedicated driver [N−1_D] does not have the high breakdown voltage transistor and the level shifter BLSTP that has a large size transistor to withstand the program voltage VPGM.

In the same manner as in the dedicated driver [N−1_D], the dedicated drivers [N−2_D], [N−3_D], [N−4_D], [N−5_D], [N+1_D], [N+2_D], [N+3_D], [N+4_D], [N+5_D], and [N±6_D] are drivers that output voltages that are applied to the non-selected word lines WL(i−2), WL(i−3), WL(i−4), WL(i−5), WL(i+1), WL(i+2), WL(i+3), WL(i+4), WL(i+5), and WL(i±6), to the CG selection circuit 302, through the wires LNM2 to LNM5, LNP1 to LNP5, and LN6, respectively. In the same manner as in the dedicated driver [N−1_D], the dedicated drivers [N−2_D], [N−3_D], [N−4_D], [N−5_D], [N+1_D], [N+2_D], [N+3_D], [N+4_D], [N+5_D], and [N±6_D] do not include the high breakdown voltage transistor and the level shifter BLSTP that has a large size transistor to withstand the program voltage VPGM.

The CG selection circuit 302 connects the wires LN, LNM1 to LNM5, LNP1 to LNP5, and LN6 to any one of the 12 wires that are collectively referred to as the wire CG<11:0>.

The CGU driver 51 includes a CGUD driver 303 and a CGUS driver 304. Moreover, the CGU driver 51 may include three or more driver circuits. For example, the CGUD driver 303 may further include two driver circuits (CGU0 and CUG1), and the CGUD driver 303 may further include two driver circuits (CGU2 and CUG3). An arbitrary configuration is possible according to a type of voltage that is output by the CGU driver 51.

For example, in the writing operation, the CGUD driver 303 outputs a voltage that is to be applied to the non-selected word line WL which is positioned on a layer over a target block BLK, to the CG driver 50 and the planes PLN0 and PLN1 through the wire CGU(D).

For example, in the writing operation, the CGUD driver 303 outputs a voltage that is to be applied to the non-selected word line WL which is positioned on a layer under the target block BLK, to the CG driver 50 and the planes PLN0 and PLN1 through the wire CGU(S).

2.2 Configuration of the Selection Driver

Next, a configuration of the selection driver 301 is described.

2.2.1 Specific Example of a Configuration of the Selection Driver.

First, a specific configuration of the selection driver 301 is described with reference to FIG. 17.

Figure 17:
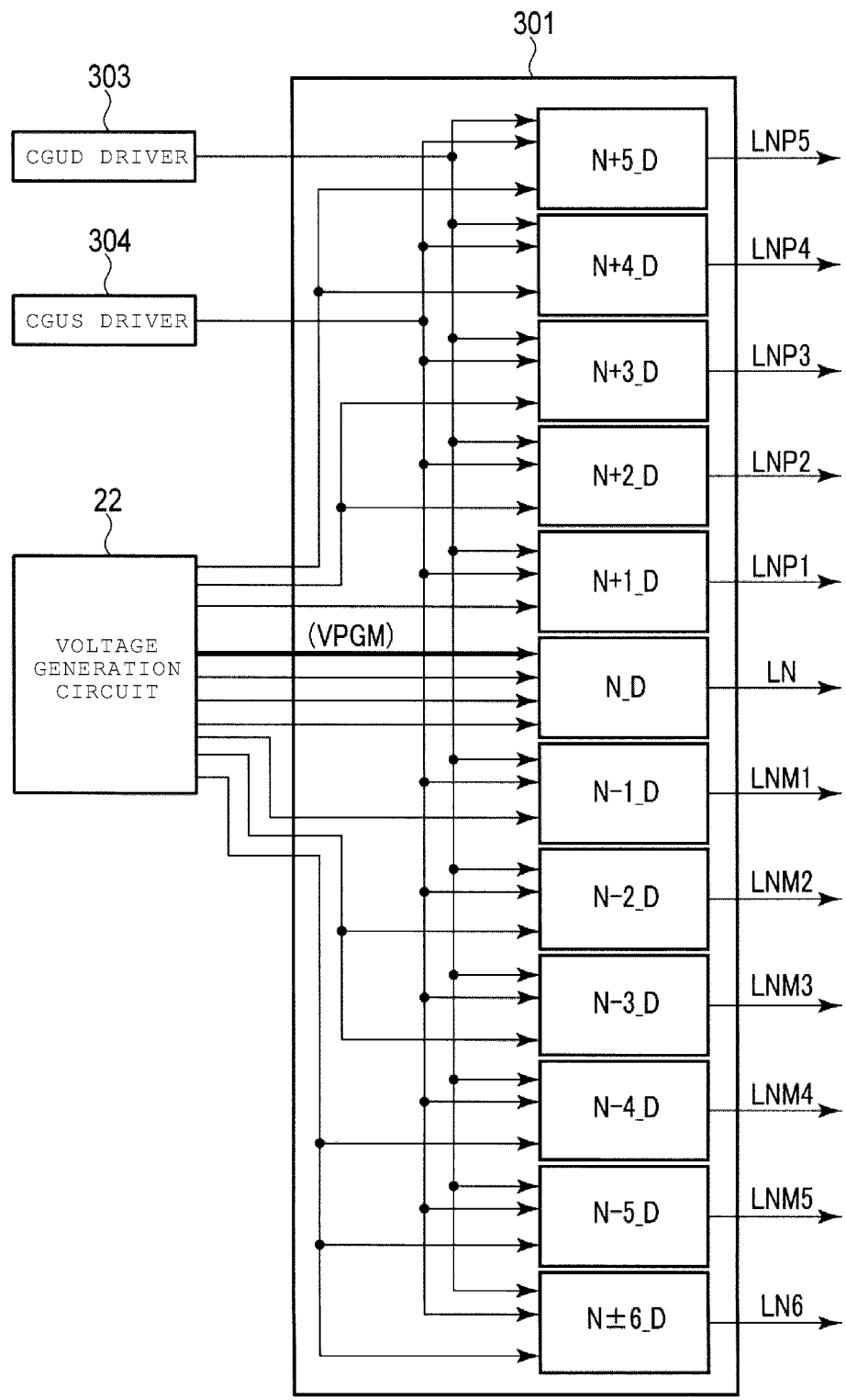
FIG. 17 is a block diagram illustrating a selection driver that is included in the semiconductor memory device according to the second embodiment.

As illustrated in FIG. 17, the dedicated driver [N_D], for example, includes four input terminals and one output terminal. Each of the four input terminals of the dedicated driver [N_D] is connected to the voltage generation circuit 22. The output terminal of the dedicated driver [N_D] is connected to the wire LN. The voltage generation circuit 22 is able to supply four types of voltages (one voltage is the program voltage VPGM) to the dedicated driver [N_D]. The dedicated driver [N_D] outputs any one of the four input voltages to the wire LN.

The dedicated driver [N+1_D], for example, includes three input terminals and one output terminal. The three input terminals of the dedicated driver [N+1_D] are connected to the voltage generation circuit 22, the CGUD driver 303, and the CGUS driver 304, respectively. Each of the CGUD driver 303 and the CGUS driver 304 is connected in common to a different dedicated driver [D] except for the dedicated drive [N_D]. The dedicated driver [N+1_D] outputs any one of the three input voltages to the wire LNP1.

Each of the dedicated drivers [N+2_D] and [N+3_D], for example, includes three input terminals and one output terminal. The three input terminals of each of the dedicated drivers [N+2_D] and [N+3_D] are connected in common to the voltage generation circuit 22, the CGUD driver 303, and the CGUS driver 304, respectively. The dedicated drivers [N+2_D] and [N+3_D] output any of the three input voltages to the wires LNP2 and LNP3, respectively.

Each of the dedicated drivers [N+4_D] and [N+5_D], for example, includes three input terminals and one output terminal. The three input terminals of each of the dedicated drivers [N+4_D] and [N+5_D] are connected in common to the voltage generation circuit 22, the CGUD driver 303, and the CGUS driver 304, respectively. The dedicated drivers [N+4_D] and [N+5_D] output any of the three input voltages to the wires LNP4 and LNP5, respectively.

The dedicated driver [N−1_D], for example, includes three input terminals and one output terminal. The three input terminals of the dedicated driver [N−1_D] are connected to the voltage generation circuit 22, the CGUD driver 303, and the CGUS driver 304, respectively. The dedicated driver [N−1_D] outputs any one of the three input voltages to the wire LNM1.

Each of the dedicated drivers [N−2_D] and [N−3_D], for example, includes three input terminals and one output terminal. The three input terminals of each of the dedicated drivers [N−2_D] and [N−3_D] are connected in common to the voltage generation circuit 22, the CGUD driver 303, and the CGUS driver 304, respectively. The dedicated drivers [N−2_D] and [N−3_D] output any of the three input voltages to the wires LNM2 and LNM3, respectively.

Each of the dedicated drivers [N−4_D], [N−5_D], and [N±6_D], for example, includes three input terminals and one output terminal. The three input terminals of each of the dedicated drivers [N−4_D], [N−5_D], and [N±6_D] are connected in common to the voltage generation circuit 22, the CGUD driver 303, and the CGUS driver 304, respectively. The dedicated drivers [N−4_D], [N−5_D], and [N±6_D] output any of the three input voltages to the wires LNM4, LNM5, and LN6, respectively.

Moreover, a configuration of the selection driver 301 is not limited to this. For each dedicated driver [D] within the selection driver 301, the number of input terminals and the connection to the voltage generation circuit 22 or the CGU driver 51 can be arbitrarily configured according to a necessary voltage. For example, each dedicated driver [D] within the selection driver 301 may be connected to the voltage generation circuit 22 through three different wires so that three types of voltages are individually supplied from the voltage generation circuit 22, and may not be connected to the CGU driver 51.

2.2.2 Configuration of the Dedicated Driver [N_D]

Next, as one specific example of the dedicated driver [D], a configuration of the dedicated driver [N_D] is described with reference to FIG. 18. In an example in FIG. 18, a case is described in which four voltages are supplied from the voltage generation circuit 22, but it is possible that the number of input voltages (input terminals) and a combination of input voltages are arbitrarily configured.

Figure 18:
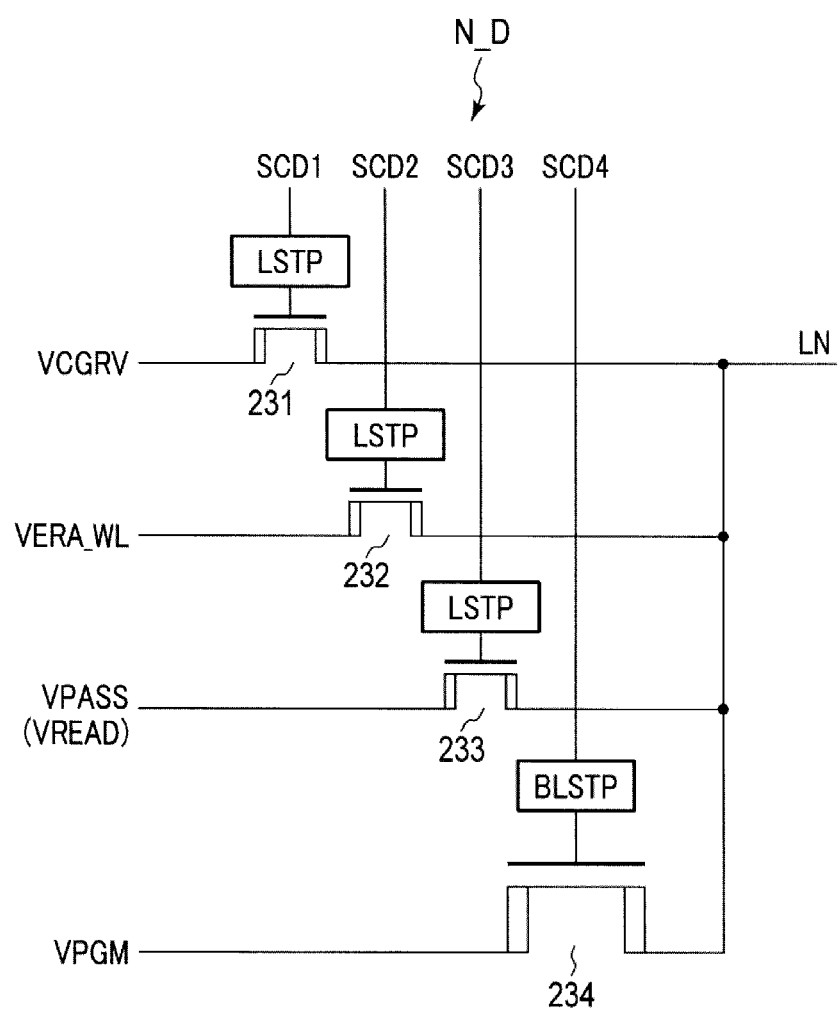
FIGS. 18-20 are circuit diagrams illustrating different dedicated drivers included in the semiconductor memory device according to the second embodiment.

As illustrated in FIG. 18, the dedicated driver [N_D] includes the level shifters LSTP that are respectively connected to gates of high breakdown voltage n channel MOS transistors 231 to 234, and gates of transistors 231 to 233, and the level shifter BLSTP that is connected to a gate of a transistor 234.

For example, the reading voltage VCGRV is applied to one end of the transistor 231, and the other end is connected to the wire LN. A gate of the transistor 231 is connected to the output terminal of the level shifter LSTP into which a control signal SCD1 that is transmitted from the SDRV control circuit 311 is input.

For example, a voltage VERA_WL that is to be applied to the word line WL for erasing is applied to one end of the transistor 232, and the other end is connected to the wire LN. A gate of the transistor 232 is connected to the output terminal of the level shifter LSTP into which a control signal SCD2 that is transmitted from the SDRV control circuit 311 is input.

For example, the voltage VPASS is applied to one end of the transistor 233 during the writing operation, and a voltage VREAD is applied to the one end of the transistor 233 during the reading operation. The other end of the transistor 233 is connected to the wire LN. A gate of the transistor 233 is connected to the output terminal of the level shifter LSTP into which a control signal SCD3 that is transmitted from the SDRV control circuit 311 is input.

The voltage VPGM is applied to one end of the transistor 234 during the writing operation, and the other end is connected to the wire LN. A gate of the transistor 234 is connected to the output terminal of the level shifter BLSTP into which a control signal SCD4 that is transmitted from the SDRV control circuit 311 is input. Because the voltage VPGM is applied to the transistor 234, the transistor 234, for example, has such a large transistor size that the transistor 234 can withstand a voltage higher than withstand voltages of other transistors 231 to 233.

2.2.3 Configuration of the Dedicated Driver [N+1_D]

Next, as one specific example of the dedicated driver [D], a configuration of the dedicated driver [N+1_D] is described with reference to FIG. 19. Moreover, it is possible that the number of input voltages and a combination of input voltages are arbitrarily configured.

Figure 19:
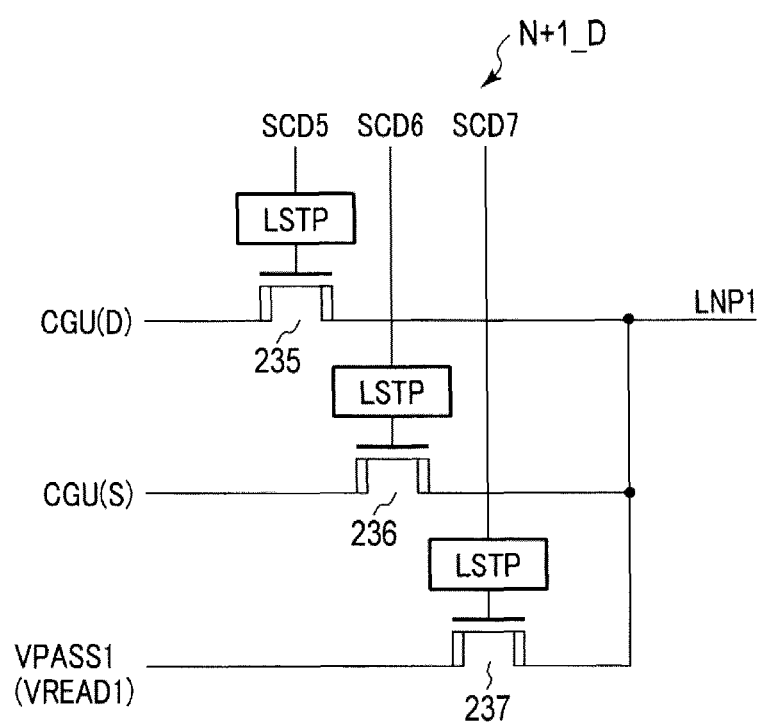

As illustrated in FIG. 19, the dedicated driver [N+1_D] includes the level shifters LSTP that are respectively connected to gates of high breakdown voltage n channel MOS transistors 235 to 237, and gates of transistors 235 to 237.

One end of the transistor 235 is connected to the wire CGU(D), and the other end is connected to the wire LNP1. A gate of the transistor 235 is connected to the output terminal of the level shifter LSTP into which a control signal SCD5 that is transmitted from the SDRV control circuit 311 is input.

One end of the transistor 236 is connected to the wire CGU(S), and the other end is connected to the wire LNP1. A gate of the transistor 236 is connected to the output terminal of the level shifter LSTP into which a control signal SCD6 that is transmitted from the SDRV control circuit 311 is input.

For example, the voltage VPASS1 is applied to one end of the transistor 237 during the writing operation, and a voltage VREAD1 is applied to the one end of the transistor 237 during the reading operation. The other end of the transistor 237 is connected to the wire LNP1. A gate of the transistor 237 is connected to the output terminal of the level shifter LSTP into which a control signal SCD7 that is transmitted from the SDRV control circuit 311 is input.

2.2.4 Configuration of the Dedicated Driver [N+3_D]

Next, as one specific example of the dedicated driver [D], a configuration of the dedicated driver [N+3_D] is described with reference to FIG. 20. Moreover, it is possible that the number of input voltages and a combination of input voltages are arbitrarily configured.

Figure 20:
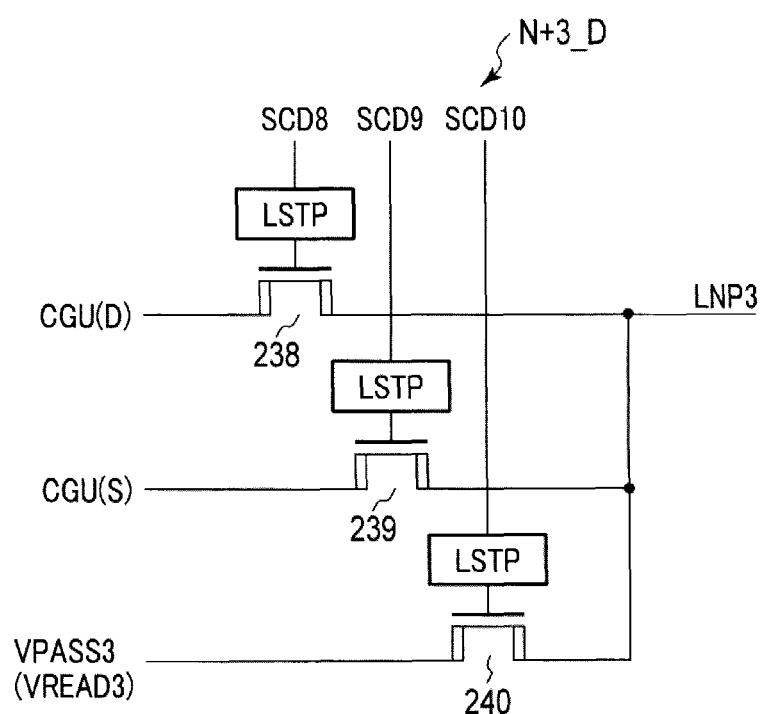

As illustrated in FIG. 20, the dedicated driver [N+3_D] includes the level shifters LSTP that are respectively connected to gates of high breakdown voltage n channel MOS transistors 238 to 240, and gates of transistors 238 to 240.

One end of the transistor 238 is connected to the wire CGU(D), and the other end is connected to the wire LNP3. A gate of the transistor 238 is connected to the output terminal of the level shifter LSTP into which a control signal SCD8 that is transmitted from the SDRV control circuit 311 is input.

One end of the transistor 239 is connected to the wire CGU(S), and the other end is connected to the wire LNP3. A gate of the transistor 239 is connected to the output terminal of the level shifter LSTP into which a control signal SCD9 that is transmitted from the SDRV control circuit 311 is input.

For example, the voltage VPASS3 is applied to one end of the transistor 240 during the writing operation, and a voltage VREAD3 is applied to the one end of the transistor 240 during the reading operation. The other end of the transistor 240 is connected to the wire LNP3. A gate of the transistor 240 is connected to the output terminal of the level shifter LSTP into which a control signal SCD10 that is transmitted from the SDRV control circuit 311 is input.

2.3 Configuration of the CG Selection Circuit

Next, a configuration of the CG selection circuit 302 is described with reference to FIG. 21.

Figure 21:
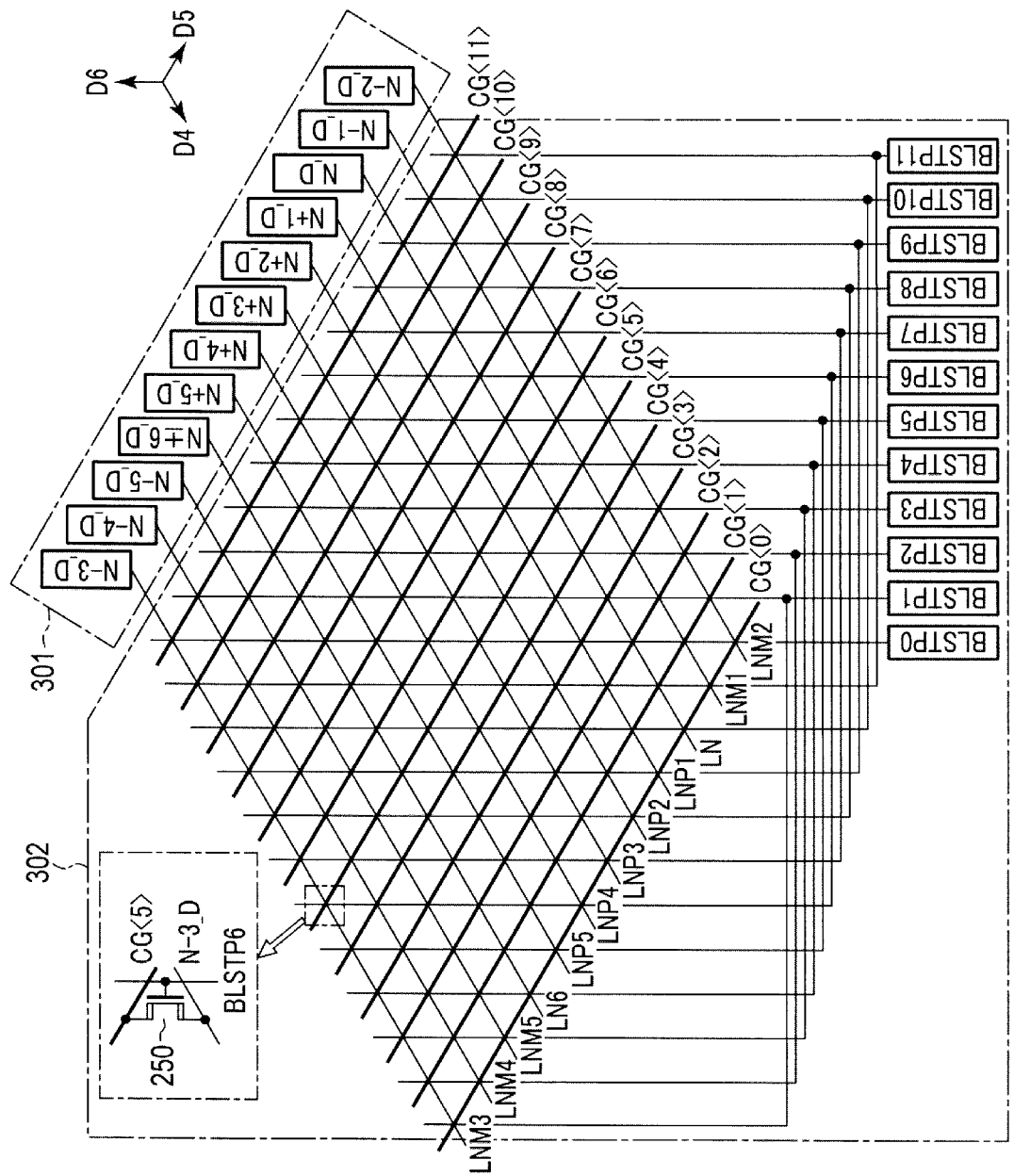
FIG. 21 is a block diagram illustrating a CG selection circuit that is included in the semiconductor memory device according to the second embodiment.

As illustrated in FIG. 21, the CG selection circuit 302 includes 144 transistors 250 that are arranged in a matrix layout, and 12 level shifters BLSTP (BLSTP0 to BLSTP11) that correspond to the wire CG<11:0>. The level shifters BLSTP (BLSTP0 to BLSTP11) are controlled by the CGFORK control circuit 312.

In an example in FIG. 21, the dedicated drivers [N−3_D], [N−4_D], [N−5_D], [N±6_D], [N+5_D], [N+4_D], [N+3_D], [N+2_D], [N+1_D], [N_D], [N−1_D], and [N−2_D], which are in the selection driver 301, are arranged toward a fifth direction D5 parallel to the semiconductor substrate 100. Then, the wires LNM3 to LNM5, LP6, LNP5 to LNP1, LN, LNM1, and LNM2 are arranged in parallel along a fourth direction D4 parallel to the semiconductor substrate 100. Then, the wire CG<11:0> is positioned in parallel along the fifth direction D5 so as to intersect these wires, and output wires for the level shifters BLSTP0 to BLSTP11 are arranged along a sixth direction parallel to the semiconductor substrate 100 so as to intersect the wire L (LN, LNP1 to LNP5, LNM1 to LNM5, and LN6) and the wire CG<11:0>. Moreover, it is possible that an arrangement of the dedicated drivers [N_D], [N−1_D], [N−2_D], [N−3_D], [N−4_D], [N−5_D], [N+1_D], [N+2_D], [N+3_D], [N+4_D], [N+5_D], and [N±6_D] is arbitrarily configured.

Each the transistor 250 is positioned at a point at which these wires intersect. One end of the transistor 250 is connected to any one of the 12 wires that are collectively referred to as the wire CG<11:0>, the other end is connected to the wire L, and a gate is connected to the output wire for any one of the level shifters BLSTP0 to BLSTP11. That is, if a "H"-level voltage is applied to the level shifter BLSTP, the transistor 250 enters into the ON state, and connects the wire L and the wire CG to each other.

In FIG. 22, relationships between the output wires for the level shifter BLSTP0 to BLSTP11, each driver "D" within the selection driver, and the wire CG<11:0> are illustrated.

As illustrated in FIG. 22, for example, if the level shifter BLSTP0 outputs the "H"-level voltage, the dedicated drivers [N−3_D], [N−4_D], [N−5_D], [N±6_D], [N+5_D], [N+4_D], [N+3_D], [N+2_D], [N+1_D], [N_D], [N−1_D], and [N−2_D] are connected to the wires CG<11> to CG<0>, respectively.

Furthermore, for example, if the level shifter BLSTP1 outputs the "H"-level voltage, the dedicated drivers [N−3_D], [N−4_D], [N−5_D], [N±6_D], [N+5_D], [N+4_D], [N+3_D], [N+2_D], [N+1_D], [N_D], [N−1_D], and [N−2_D] are connected to the wires CG<0>, CG<11> to CG<1>, respectively.

Even though other level shifters BLSTP1 to BLSTP11 output the "H"-level voltage, in the same manner, the dedicated drivers [N−3_D], [N−4_D], [N−5_D], [N±6_D], [N+5_D], [N+4_D], [N+3_D], [N+2_D], [N+1_D], [N_D], [N−1_D], and [N−2_D] are connected to any one of the 12 wires that are collectively referred to as the wire CG<11:0>.

That is, by controlling the level shifters BLSTP1 to BLSTP11, for example, the dedicated driver [N_D] that corresponds to the selected word line WL can be connected to any one of the 12 wires that are collectively referred to as the wire CG<11:0>.

2.4 Effect According to the Present Embodiment

The semiconductor memory device according to the present embodiment can suppress the increase in the chip area. The present effect will be specifically described.

For example, if voltages of 12 word lines WL that include the selected word line WL are applied to any one of the 12 wires that are collectively referred to as the CG<11:0>, it is necessary to switch a voltage that is to be applied to the wire CG<11:0>, according to the selected word line WL. For example, the CG driver needs to be configured so that the program voltage VPGM can be applied to any one of the 12 wires that are collectively referred to as the wire CG<11:0>. Therefore, if the 12 drivers are provided within the CG driver that corresponds to the wire CG<11:0>, each driver needs to be able to correspond to all voltages that are to be applied to the 12 word lines WL that include the selected word line WL. For this reason, in most cases, each driver includes a number of switch circuits (transistors+LSTPs) that correspond to the voltage which is to be applied to the 12 word lines WL. More specifically, for example, during the writing, if it is necessary to apply eight types of voltages that include the program voltage VPGM, each driver is configured to include a minimum of eight switch circuits that include the switch circuit that correspond to the program voltage VPGM. A driver circuit scale of the driver having this configuration is enlarged according to a type of necessary voltage. Furthermore, because each driver includes the switch circuit (the high breakdown voltage transistor and the level shifter BLSTP that have large scales) that corresponds to the program voltage VPGM, the circuit scale thereof is further enlarged.

In contrast, in the configuration according to the present embodiment, the semiconductor memory device includes the row driver 24 that includes the CG driver 50. The CG driver 50 includes the selection driver 301 and the CG selection circuit 302. The selection driver 301, for example, includes 12 dedicated drivers that correspond to the word lines WL (i±6) which include the selected word line WLi. Furthermore, the CG selection circuit 302 can output an output voltage of each dedicated driver to any one of the 12 wires that are collectively referred to as the wire CG<11:0>. Accordingly, since it is only necessary that the voltage that is to be applied to the corresponding word line WL can be output in each dedicated driver, the number of switch circuits within the dedicated driver can be reduced. Consequently, even though the number of types of voltage that are necessary for miniaturization and multi-leveling is increased, an increase in the number of switch circuits within each dedicated driver can be suppressed. Therefore, the increase in the chip area can be suppressed.

Furthermore, for example, it is only necessary that the switch circuit that includes a large circuit area which corresponds to the program voltage VPGM is included in the dedicated driver [N_D] that corresponds to the selected word line WLi, and it is not necessary that the switch circuit is included in the dedicated driver that corresponds to other non-selected word lines WL. Therefore, the number of switch circuits each of which includes a large circuit area that corresponds to the program voltage VPGM, that is, the number of level shifters BLSTP can be reduced. Therefore, the increase in the chip area can be suppressed.

In the configuration according to the present embodiment, the row driver control circuit 23 includes the SDRV control circuit 311 that controls the selection driver 301, and the CGFORK control circuit 312 that controls the CG selection circuit 302. For example, based on a configuration value of the voltage that is to be applied to the word line WL and output timing information, the SDRV control circuit 311 controls the selection driver 301. Based on the address information ADD, the CGFORK control circuit 312 controls the CG selection circuit 302. Therefore, the row driver control circuit 23 does not need to generate the control signal SCD that is obtained by combining the configuration value of the voltage that is to be applied to the word line WL, the timing information of output and the address information ADD. Because of this, the circuit that generates the control signal SCD can be simplified. Therefore, an increase in the circuit area of the row driver control circuit 23 can be suppressed, and the increase in the chip area can be suppressed.

3. Modification Example and Others

A semiconductor memory device according to the embodiments described above includes: a memory string (e.g., memory string 16 in FIG. 3) that includes first to fourth memory cells (e.g., MT in FIG. 3) which are connected in series to one another; first to fourth word lines (e.g., WL in FIG. 3) that are connected to gates of the first to fourth memory cells, respectively; a voltage generation circuit (e.g., voltage generation circuit 22 in FIG. 1) that generates a first voltage; a first circuit (e.g., zone selection circuit 34A in FIG. 6) that is able to output the first voltage to one of first and second wires; a second circuit (e.g., lower layer WL selection circuit 32C0 in FIG. 6) that is able to connect the first and second wires to the first and second word lines, respectively; and a third circuit (e.g., upper layer WL selection circuit 33C0 in FIG. 6) that is able to connect the first and second wires to the third and fourth word lines, respectively, to each other.

With application of the embodiments described above, a semiconductor memory device can be provided that is capable of suppressing the increase in the chip area. Moreover, the embodiments described above are not limiting, and various modifications to the embodiments are possible.

For example, one of the first and second embodiments may be applied to the semiconductor memory device, and both of the first and second embodiments may be applied to the semiconductor memory device.

Additionally, the embodiments described above can be applied not only to a three-dimensional stacked NAND flash memory that is different from the embodiment described above, but also to a plane (two-dimensional) NAND flash memory. Additionally, the embodiments described above are not limited to the NAND flash memory, and can be applied also to a semiconductor memory device that applies a plurality of voltages to a plurality of word lines which are connected to a plurality of memory cells.

In the embodiments described above, the "connections" include a state in which a connection is indirectly made, for example, with involving any of transistor and a resistor, and the like in between.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Moreover, each embodiment may be as follows. For example, when the memory cell transistor MT is able to retain 2-bit (four values) data and any one of the four values is retained, a threshold level is changed from a low level to an E level (erasing level), a A level, a B level, and a C level, (1) in the reading operation, a voltage that is applied to a word line which is selected for the reading operation at the A level, for example, falls within a range of from 0 V to 0.55 V. It is not limited to this case, and such a voltage falls within any one of the ranges of from 0.1 V to 0.24 V, from 0.21 V to 0.31 V, from 0.31 V to 0.4 V, from 0.4 V to 0.5 V, and from 0.5 V to 0.55 V.

A voltage that is applied to the word line which is selected in a B-level reading operation, for example, falls within a range of from 1.5 V to 2.3 V. It is not limited to this case, and the voltage may fall within any one of the ranges of from 1.65 V to 1.8 V, from 1.8 V to 1.95 V, from 1.95 V to 2.1 V, and from 2.1 V to 2.3 V.

A voltage that is applied to the word line which is selected in a C-level reading operation, for example, falls within a range of from 3.0 V to 4.0 V. It is not limited to this case, and the voltage may fall within any one of the ranges of from 3.0 V to 3.2 V, from 3.2 V to 3.4 V, from 3.4 V to 3.5 V, from 3.5 V to 3.6 V, and from 3.6 V to 4.0 V.

Time (tR) for the reading operation, for example, may fall within any one of the ranges of from 25 µs to 38 µs, from 38 µs to 70 µs, and from 70 µs to 80 µs.

(2) The writing operation includes a program operation and a verification operation as described above. In the writing operation, a voltage that is first applied to the word line which is selected when the program operation is performed, for example, falls within a range of from 13.7 V to 14.3 V. It is not limited to this case, and for example, the voltage may fall within any one of the ranges of from 13.7 V to 14.0 V and from 14.0 V to 14.6 V.

A voltage that is first applied to the selected word line when the writing is performed through an odd-numbered word line and a voltage that is first applied to the selected word line when the writing is performed through an even-numbered word line may be changed.

When an Incremental Step Pulse Program (ISPP) scheme is adopted for the program operation, for example, approximately 0.5 V is given as a step-up voltage.

A voltage that is applied to a non-selected word line, for example, may fall within a range of from 6.0 V to 7.3 V. It is not limited to this case, and for example, the voltage may fall within a range of from 7.3 V to 8.4V, and may be equal to or less than 6.0 V.

A bus voltage that is applied may be changed depending on whether the non-selected word line is an odd-numbered word line or an even-numbered word line.

Time (tProg) for the reading operation, for example, may fall within any one of the ranges of from 1,700 µs to 1,800 µs, from 1,800 µs to 1,900 µs, and from 1,900 µs to 2,000 µs.

(3) For the erasing operation, for example, a voltage that is first applied to a well which is formed on an upper portion of a semiconductor substrate and above which the above-described memory cells are arranged may fall within a range of from 12 V to 13.6 V. It is not limited to this case, and for example, the voltage may fall within any one of the ranges of from 13.6 V to 14.8 V, from 14.8 V to 19.0 V, from 19.0 to 19.8 V, and from 19.8 V to 21 V.

Time (tErase) for the erasing operation, for example, may fall within any one of the ranges of from 3,000 µs to 4,000 µs, from 4,000 µs to 5,000 µs, and from 4,000 µs to 9,000 µs.

(4) A structure of the memory cell includes an electric charge accumulation layer that is positioned, through a tunnel insulating film with a thickness of from 4 to 10 nm, on a semiconductor substrate (silicon substrate). The electric charge accumulation layer can have a structure in which an insulating film of SiN, SiON, or the like, which is from 2 to 3 nm in thickness, and a film of polysilicon that is from 3 to 8 nm in thickness are stacked. Furthermore, a metal such as Ru may be added to the polysilicon. The electric charge accumulation layer includes an insulating film thereon. The insulating film, for example, includes a silicon oxide film with a thickness of from 4 to 10 nm, which is interposed between a lower layer High-k film with a thickness of from 3 to 10 nm and an upper layer High-k film with a thickness of from 3 to 10 nm. For the High-k film, HfO or the like is used. Furthermore, the thickness of the silicon oxide film can be greater than the thickness of the High-k film. A control electrode with a thickness of from 30 to 70 nm is formed, through a material with a thickness of from 3 to 10 nm on the insulating film. Such material is a film of metal oxide such as TaO or a film of metal nitride such as TaN. For the control electrode, W or the like is used.

Furthermore, an air gap can be formed between memory cells.

What is claimed is:

1. A semiconductor memory device comprising:
   a bit line;
   a source line;
   a memory string that is provided between the bit line and the source line and includes a plurality of memory cells electrically connected in series, the memory cells including a first memory cell, a second memory cell, a third memory cell, and a fourth memory cell;
   a plurality of word lines electrically connected to gates of the memory cells, respectively, the word lines including:
      a first word line connected to a gate of the first memory cell,
      a second word line connected to a gate of the second memory cell,
      a third word line connected to a gate of the third memory cell, and
      a fourth word line connected to a gate of the fourth memory cell;
   a voltage generation circuit configured to generate a plurality of first voltages;
   a first circuit configured to output the first voltages to one of a plurality of first wires;
   a second circuit configured to connect the first wires to one of a set of the first word line and the second word line, or a set of the third word line and the fourth word line, respectively; and
   a third circuit configured to connect a plurality of second wires to the other one of the set of the first word line and the second word line, or the set of the third word line and the fourth word line, respectively.

2. The semiconductor memory device according to claim 1, wherein the memory cells include N memory cells and the first and third memory cells are separated by (N/2−1) memory cells and the second and fourth memory cells are separated by (N/2−1) memory cells.

3. The semiconductor memory device according to claim 1, wherein the first circuit outputs the first voltages to the first wires, respectively, if one of the first and third memory cells is selected, and outputs the first voltages to the second wires, respectively, if one of the second and fourth memory cells is selected.

4. The semiconductor memory device according to claim 1, further comprising:
   a substrate, wherein the first memory cell is located above the substrate, the second memory cell is located above the first memory cell, the third memory cell is located above the second memory cell, and the fourth memory cell is located above the third memory cell.

5. The semiconductor memory device according to claim 4, wherein
   the voltage generation circuit is further configured to generate a second voltage and a third voltage, and the first circuit is further configured to output one of the second voltage and the third voltage to the second wires.

6. The semiconductor memory device according to claim 5, wherein
   the memory cells further includes a fifth memory cell, a sixth memory cell, a seventh memory cell, and an eighth memory cell,
   the word lines further includes:
      a fifth word line connected to a gate of the fifth memory cell,
      a sixth word line connected to a gate of the sixth memory cell,
      a seventh word line connected to a gate of the seventh memory cell, and
      an eighth word line connected to a gate of the eighth memory cell,
   the semiconductor memory device further comprises:
      a fourth circuit configured to output the first voltages to one of a plurality of third wires, and output one of the second voltage and the third voltage to a plurality of fourth wires;
      a fifth circuit configured to connect the third wires to one of a set of the fifth word line and the sixth word line, or a set of the seventh word line and the eighth word line, respectively; and
      a sixth circuit configured to connect the fourth wires to the other one of the set of the fifth word line and the sixth word line, or the set of the seventh word line and the eighth word line, respectively.

7. The semiconductor memory device according to claim 6, wherein the fifth memory cell is located above the second memory cell, the sixth memory cell is located above the fifth memory cell, the seventh memory cell is located above the fourth memory cell, and the eighth memory cell is located above the seventh memory cell.

8. The semiconductor memory device according to claim 1, wherein
   the memory cells are formed in a memory hole that penetrates the word lines in a first direction, and
   the memory hole includes a non-continuous point between a position corresponding to the second memory cell and a position corresponding to the third memory cell in the first direction.

9. A method for controlling a semiconductor memory device including:
   a bit line;
   a source line;
   a memory string that is provided between the bit line and the source line and includes a plurality of memory cells electrically connected in series, the memory cells including a first memory cell, a second memory cell, a third memory cell, and a fourth memory cell; and
   a plurality of word lines electrically connected to gates of the memory cells, respectively, the word lines including:
      a first word line connected to a gate of the first memory cell,
      a second word line connected to a gate of the second memory cell,
      a third word line connected to a gate of the third memory cell, and
      a fourth word line connected to a gate of the fourth memory cell, the method comprising:

generating a plurality of first voltages;

outputting the first voltages to one of a plurality of first wires;

connecting the first wires to one of a set of the first word line and the second word line, or a set of the third word line and the fourth word line, respectively; and connecting a plurality of second wires to the other one of the set of the first word line and the second word line, or the set of the third word line and the fourth word line, respectively.

10. The method according to claim 9, wherein the memory cells include N memory cells and the first and third memory cells are separated by (N/2−1) memory cells and the second and fourth memory cells are separated by (N/2−1) memory cells.

11. The method according to claim 9, wherein the first voltages are output to the first wires, respectively, if one of the first and third memory cells is selected, and to the second wires, respectively, if one of the second and fourth memory cells is selected.

12. The method according to claim 9, wherein the semiconductor memory device further includes a substrate, and the first memory cell is located above the substrate, the second memory cell is located above the first memory cell, the third memory cell is located above the second memory cell, and the fourth memory cell is located above the third memory cell.

13. The method according to claim 12, further comprising:

generating a second voltage and a third voltage; and outputting one of the second voltage and the third voltage to the second wires.

14. The method according to claim 13, wherein the memory cells further includes a fifth memory cell, a sixth memory cell, a seventh memory cell, and an eighth memory cell, the word lines further includes:

a fifth word line connected to a gate of the fifth memory cell, a sixth word line connected to a gate of the sixth memory cell, a seventh word line connected to a gate of the seventh memory cell, and an eighth word line connected to a gate of the eighth memory cell, and the method further comprises:

outputting the first voltages to one of a plurality of third wires, and output one of the second voltage and the third voltage to a plurality of fourth wires;

connecting the third wires to one of a set of the fifth word line and the sixth word line, or a set of the seventh word line and the eighth word line, respectively; and connecting the fourth wires to the other one of the set of the fifth word line and the sixth word line, or the set of the seventh word line and the eighth word line, respectively.

15. The method according to claim 14, wherein the fifth memory cell is located above the second memory cell, the sixth memory cell is located above the fifth memory cell, the seventh memory cell is located above the fourth memory cell, and the eighth memory cell is located above the seventh memory cell.

16. The method according to claim 9, wherein the memory cells are formed in a memory hole that penetrates the word lines in a first direction, and the memory hole includes a non-continuous point between a position corresponding to the second memory cell and a position corresponding to the third memory cell in the first direction.

* * * * *

UNITED STATES PATENT AND TRADEMARK OFFICE
CERTIFICATE OF CORRECTION

PATENT NO. : 11,145,371 B2
APPLICATION NO. : 17/158321
DATED : October 12, 2021
INVENTOR(S) : Sanad Bushnaq It is certified that error appears in the above-identified patent and that said Letters Patent is hereby corrected as shown below:

In the Claims

In Column 38, Claim 6, Line 6, please replace "includes" with --include--.

In Column 38, Claim 6, Line 9, please replace "includes" with --include--.

In Column 40, Claim 14, Line 2, please replace "includes" with --include--.

In Column 40, Claim 14, Line 5, please replace "includes" with --include--.

Signed and Sealed this
Twenty-fifth Day of October, 2022

Katherine Kelly Vidal
*Director of the United States Patent and Trademark Office*